(12) United States Patent
Tillotson

(10) Patent No.: US 10,581,413 B2
(45) Date of Patent: Mar. 3, 2020

(54) COMPENSATION CIRCUIT

(71) Applicant: Honeywell International Inc., Morris Plains, NJ (US)

(72) Inventor: John K. Tillotson, Petoskey, MI (US)

(73) Assignee: Honeywell International Inc., Morris Plains, NJ (US)

( * ) Notice: Subject to any disclaimer, the term of this patent is extended or adjusted under 35 U.S.C. 154(b) by 105 days.

(21) Appl. No.: 15/816,582

(22) Filed: Nov. 17, 2017

(65) Prior Publication Data

US 2019/0158077 A1 May 23, 2019

(51) Int. Cl.
*H01L 35/00* (2006.01)
*H03K 5/02* (2006.01)
*G01D 3/036* (2006.01)

(52) U.S. Cl.
CPC ............... *H03K 5/02* (2013.01); *G01D 3/036* (2013.01)

(58) Field of Classification Search
CPC ........................................................ H03K 5/02
USPC ........................................................ 327/513
See application file for complete search history.

(56) References Cited

U.S. PATENT DOCUMENTS

| 4,628,277 A * | 12/1986 | Hill ...................... G01R 19/257 324/105 |
| 4,883,992 A | 11/1989 | Koglin et al. |
| 5,053,692 A * | 10/1991 | Craddock ............. G01L 1/2281 310/315 |
| 5,419,199 A | 5/1995 | Kraki |
| 5,686,826 A * | 11/1997 | Kurtz .................... G01L 1/2281 323/365 |

* cited by examiner

*Primary Examiner* — Metasebia T Retebo
(74) *Attorney, Agent, or Firm* — Seager, Tufte & Wickhem LLP

(57) ABSTRACT

A device for adjusting a signal to a thermally sensitive bridge circuit that may have an impedance coupled to the bridge circuit and an impedance circuit also coupled to the bridge circuit. The impedance circuit may incorporate an amplifier having a non-inverting input coupled to the bridge circuit, a signal adjusting circuit coupled to the output terminal of the amplifier and to the bridge circuit, and an amplifier circuit coupled to the output of the amplifier. The signal adjusting circuit may include a unidirectional current flow mechanism such as a diode.

17 Claims, 35 Drawing Sheets

COMPENSATION CIRCUIT

TECHNICAL FIELD

The disclosure relates generally to compensation circuits, and more particularly to a circuit for reducing the span error of an output signal from a bridge circuit.

BACKGROUND

The resistance and sensitivity of piezo-resistive bridges vary significantly with temperature. As a result, the signal output of piezo-resistive bridges varies significantly as a function of temperature. Customarily, the bridge resistance variation is used to passively vary the bridge excitation to normalize the signal output. A common method of compensation is to place a resistance in series with the bridge. This compensation occurs because the bridge resistance increases as the temperature increases. As a result, the excitation of the bridge increases which compensates for the loss of bridge sensitivity from increasing temperature. However, to achieve self-compensation, a resistance used in series with the bridge can waste about two-thirds of the available power supply voltage. In addition to wasting the bridge excitation voltage, this compensation is not usable over a wide temperature range because it is non-linear. Usually a micro-controller based ASIC is used to provide a matching non-linear signal path to achieve compensation over a wider temperature range. However, micro-controllers are cost prohibitive in most aerospace pressure sensor applications because of the DO-178 software certification requirements. Likewise an ASIC would need DO-254 certification and would likely lead to obsolescence issues in the 40 year long life cycles encountered in the aerospace industry.

What would be desirable is a non-linear compensation system that attenuates the waste of the available power supply voltage and achieves a compensation over a wider temperature range without the use of micro-controllers or ASICs.

SUMMARY

In an example of the disclosure, a device for adjusting a signal to a thermally sensitive bridge circuit may comprise a first impedance that may have a first terminal coupled to a terminal of the bridge circuit and an impedance circuit coupled to the terminal of the bridge circuit. The impedance circuit may comprise an amplifier that may have a non-inverting input terminal coupled to the terminal of the bridge circuit, an inverting input terminal, and an output terminal, a signal adjusting circuit that may have a second impedance with a first terminal coupled to the output terminal of the amplifier and a second terminal coupled to the terminal of the bridge circuit, the second impedance may include a diode, and an amplifier circuit that may have a third impedance with a terminal coupled to the output terminal of the amplifier.

Alternatively or additionally to the foregoing, the first impedance may comprise a first resistor and the second impedance of the signal adjusting circuit may further include a second resistor that may have a first terminal coupled to the output terminal of the amplifier and a second terminal coupled to the terminal of the bridge circuit, and a fourth impedance in parallel with the second resistor. The fourth impedance may include the diode that may have an anode end coupled to the output terminal of the amplifier, and a third resistor that may have a first terminal coupled to a cathode end of the diode and a second terminal coupled to the terminal of the bridge circuit.

Alternatively or additionally to any of the embodiments above, the third impedance of the amplifier circuit may include a fourth resistor that may have a first terminal coupled to the output terminal of the amplifier and a second terminal coupled to the inverting terminal of the amplifier, and a voltage divider circuit that may include a fifth resistor that may have a first terminal coupled to the inverting terminal of the amplifier and a second terminal coupled to a signal generating source, and a sixth resistor that may have a first terminal coupled to the non-inverting terminal of the amplifier and a second terminal coupled to ground.

Alternatively or additionally to any of the embodiments above, the amplifier may be an operational amplifier.

Alternatively or additionally to any of the embodiments above, the second impedance of the signal adjusting circuit may further include a fifth impedance in parallel with the second resistor. The fifth impedance may include a second diode that may have a cathode end coupled to the output terminal of the amplifier, and a seventh resistor may have a first terminal coupled to an anode end of the diode and a second terminal coupled to the terminal of the bridge.

Alternatively or additionally to any of the embodiments above, the device may further comprise a fifth impedance coupled to the terminal of the bridge circuit. The fifth impedance circuit may comprise a second amplifier having a non-inverting input terminal, an inverting input terminal, and an output terminal with the non-inverting input terminal coupled to the terminal of the bridge circuit, a second signal adjusting circuit having a sixth impedance with a first terminal coupled to the output terminal of the second amplifier and a second terminal coupled to the terminal of the bridge circuit, and a second amplifier circuit that may have a seventh impedance coupled to the output terminal of the second amplifier.

Alternatively or additionally to any of the embodiments above, the sixth impedance of the second signal adjusting circuit may comprise an eighth resistor and the seventh impedance of the second amplifier circuit may include a ninth resistor having a first terminal coupled to the output terminal of the second amplifier and a second terminal coupled to the inverting terminal of the second amplifier, and a second voltage divider circuit that may include a tenth resistor that may have a first terminal coupled to the inverting terminal of the second amplifier and a second terminal coupled to the signal generating source, and an eleventh resistor that may have a first terminal coupled to the non-inverting terminal of the second amplifier and a second terminal coupled to the ground.

Alternatively or additionally to any of the embodiments above, the second amplifier may be a second operational amplifier.

Alternatively or additionally to any of the embodiments above, the bridge circuit may be a piezo-resistive bridge circuit.

In another example of the disclosure, a compensation circuit for a piezo-resistive bridge circuit that may have an output terminal coupled to a bridge output node and a first impedance having a terminal coupled to the bridge output node. The compensation circuit may comprise an amplifier that may have a non-inverting input terminal coupled to the bridge output node, an inverting input terminal coupled to an inverting input node, and an amplifier output terminal coupled to an amplifier output node, a negative feedback loop that may have a second impedance with a first terminal coupled to the inverting input node and a second terminal coupled to the amplifier output node, and a positive feedback loop that may have a third impedance with a first terminal coupled to the bridge output node and a second terminal coupled to the amplifier output node, the third impedance may include a diode such that exceeding a forward threshold voltage of the diode allows current to flow from the amplifier output node through the positive feedback loop to the bridge output node.

Alternatively or additionally to the foregoing, the third impedance of the positive feedback loop may further include a first resistor that may have a first terminal coupled to the amplifier output node and a second terminal coupled to the bridge output node, a fourth impedance in parallel with the second resistor. The fourth impedance may include the diode may have an anode end coupled to the amplifier output node, and a third resistor that may have a first terminal coupled to a cathode end of the diode and a second terminal coupled to the bridge output node.

Alternatively or additionally to any of the embodiments above, the second impedance of the negative feedback loop may further include a fourth resistor that may have a first terminal coupled to the amplifier output node and a second terminal coupled to the inverting input node, and a voltage divider circuit that may include a fifth resistor that may have a first terminal coupled to the inverting input node and a second terminal coupled to a signal generating source, and a sixth resistor that may have a first terminal coupled to the non-inverting input node and a second terminal coupled to ground.

Alternatively or additionally to any of the embodiments above, the amplifier may be an operational amplifier.

Alternatively or additionally to any of the embodiments above, the third impedance of the positive feedback loop may further include a fifth impedance in parallel with the second resistor. The fifth impedance may include a seventh resistor having a first terminal coupled to the bridge output node, and a second diode may have an anode end coupled to a second terminal of the seventh resistor and a cathode end coupled to the amplifier output node such that exceeding a forward threshold voltage of the second diode may allow current to flow from the bridge output node through the positive feedback loop to the amplifier output node.

Alternatively or additionally to any of the embodiments above, the compensation circuit may further comprise a second operational-amplifier that may have a non-inverting input terminal coupled to the bridge output node, an inverting input terminal coupled to a second inverting input node, and an amplifier output terminal coupled to a second amplifier output node, a second negative feedback loop that may have a fifth impedance with a first terminal coupled to the second inverting input node and a second terminal coupled to the amplifier output node, and a second positive feedback loop that may have a sixth impedance with a first terminal coupled to the bridge output node and a second terminal coupled to the amplifier output node.

Alternatively or additionally to any of the embodiments above, the sixth impedance of the second positive feedback loop may comprise a seventh resistor and the fifth impedance of the second negative feedback loop may include an eighth resistor that may have a first terminal coupled to the second amplifier output node and a second terminal coupled to the second inverting input node, and a second voltage divider circuit that may include a ninth resistor that may have a first terminal coupled to the second inverting input node and a second terminal coupled to the signal generating source, and a tenth resistor that may have a first terminal coupled to the second non-inverting input node and a second terminal coupled to the ground.

In another example of the disclosure, a compensation circuit for a piezo-resistive bridge circuit may comprise a first impedance having a terminal coupled to a bridge output node that may also be coupled to a terminal of the piezo-resistive bridge circuit, an operational-amplifier that may have a non-inverting input terminal coupled to the bridge output node, an inverting input terminal coupled to an inverting input node, and an operational-amplifier output terminal coupled to an amplifier output node, a negative feedback loop that may have a second impedance with a first terminal coupled to the inverting input node and a second terminal coupled to the amplifier output node, and a positive feedback loop that may have a third impedance with a first terminal coupled to the bridge output node and a second terminal coupled to the amplifier output node, the third impedance may include a diode such that exceeding a forward threshold voltage of the diode may allow current to flow from the amplifier output node through the positive feedback loop to the bridge output node.

Alternatively or additionally to any of the embodiments above, the first impedance may be a first resistor and the third impedance of the positive feedback loop may further includes a second resistor that may having a first terminal coupled to the amplifier output node and a second terminal coupled to the bridge output node, and a fourth impedance in parallel with the second resistor. The fourth impedance may include the diode that may have an anode end coupled to the amplifier output node, and a third resistor that may have a first terminal coupled to a cathode end of the diode and a second terminal coupled to the bridge output node, and the second impedance of the negative feedback loop may include a fourth resistor that may have a first terminal coupled to the amplifier output node and a second terminal coupled to the inverting input node, and a voltage divider circuit that may include a fifth resistor that may have a first terminal coupled to the inverting input node terminal and a second terminal coupled to a signal generating source, and a sixth resistor that may have a first terminal coupled to the non-inverting input node and a second terminal coupled to ground.

Alternatively or additionally to any of the embodiments above, the third impedance of the positive feedback loop may further include a fifth impedance in parallel with the second resistor that may include a seventh resistor that may have a first terminal coupled to the bridge output node, and a second diode that may have an anode end coupled to a second terminal of the seventh resistor and a cathode end coupled to the amplifier output node such that exceeding a forward threshold voltage of the second diode may allow current to flow from the bridge output node through the positive feedback loop to the amplifier output node.

Alternatively or additionally to any of the embodiments above, the compensation circuit may further comprise a second operational-amplifier that may have a non-inverting input terminal coupled to the bridge output node, an inverting input terminal coupled to a second inverting input node, and an amplifier output terminal coupled to a second amplifier output node, a second negative feedback loop that may have a fifth impedance with a first terminal coupled to the second inverting input node and a second terminal coupled to the amplifier output node, and a second positive feedback loop that may have a sixth impedance with a first terminal coupled to the bridge output node and a second terminal coupled to the amplifier output node.

The above summary of some illustrative embodiments is not intended to describe each disclosed embodiment or every implementation of the present disclosure. The Figures and Description which follow more particularly exemplify these and other illustrative embodiments.

BRIEF DESCRIPTION OF THE DRAWING

The disclosure may be more completely understood in consideration of the following description in connection with the accompanying drawings, in which.

Figure 1A:
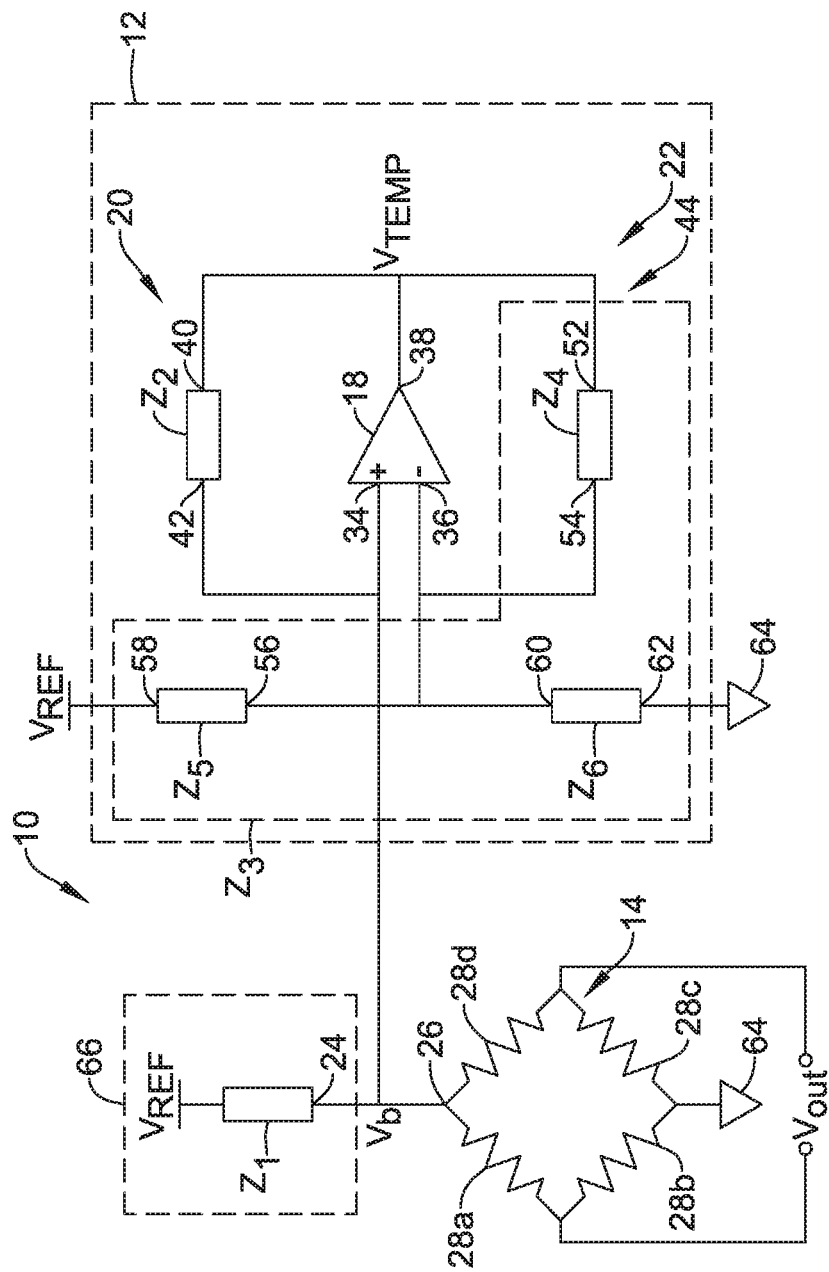
FIG. 1A depicts an exemplary device.

While the disclosure is amenable to various modifications and alternative forms, specifics thereof have been shown by way of example in the drawing and will be described in detail. It should be understood, however, that the intention is not to limit the disclosure to the particular embodiments described. On the contrary, the intention is to cover all modifications, equivalents, and alternatives falling within the spirit and scope of the disclosure.

DESCRIPTION

For the following defined terms, these definitions shall be applied, unless a different definition is given in the claims or elsewhere in this specification.

All numeric values are herein assumed to be modified by the term "about," whether or not explicitly indicated. The term "about" generally refers to a range of numbers that one of skill in the art would consider equivalent to the recited value (i.e., having the same function or result). In many instances, the terms "about" may include numbers that are rounded to the nearest significant figure.

The recitation of numerical ranges by endpoints includes all numbers within that range (e.g. 1 to 5 includes 1, 1.5, 2, 2.75, 3, 3.80, 4, and 5).

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", and so forth, indicate that the embodiment described may include one or more particular features, structures, and/or characteristics. However, such recitations do not necessarily mean that all embodiments include the particular features, structures, and/or characteristics. Additionally, when particular features, structures, and/or characteristics are described in connection with one embodiment, it should be understood that such features, structures, and/or characteristics may also be used connection with other embodiments whether or not explicitly described unless clearly stated to the contrary.

The following description should be read with reference to the drawings in which similar structures in different drawings are numbered the same. The drawings, which are not necessarily to scale, depict illustrative embodiments and are not intended to limit the scope of the disclosure.

FIG. 1A depicts a high-level view of a device 10. In some cases, the device 10 may be a compensation circuit. In some cases, the compensation circuit may include a positive impedance 66, a negative impedance 12, and a bridge 14. In some cases, the bridge circuit 14 may be part of a pressure measuring device such as a piezo-resistive sensor integrally diffused within a diaphragm of semiconducting material such as silicon, for example. In some cases, the pressure measuring device may be fabricated using solid state techniques that involve the diffusion or deposition of a force sensitive arrangement of piezo-resistors 28A-28D on a semiconductor diaphragm. In some cases, the piezo-resistors 28A-28D of the bridge circuit 14 may be formed in a four active arm Wheatstone bridge configuration providing an output ($V_{out}$) proportional to pressure and/or deflection. The stress sensors or piezo-resistors 28A-28D of the bridge circuit 14 may be arranged so that two elements 28A and 28C of the four are subjected to tension and two elements 28B and 28D are subjected to compression. This type of arrangement may be referred to as an integral or integrated transducer and in some examples, the piezo-resistive sensing elements 28A-28D may be deposited, diffused or otherwise formed on a semiconductor substrate employing fabrication techniques used in integrated circuit technology. In FIG. 1A, a full-bridge array is shown, however, in some cases a half-bridge array may be used. In either case, as a result of applied pressure, the output ($V_{out}$) of the bridge circuit 14, when supplied with a constant direct current (DC) or alternating current (AC) voltage ($V_{REF}$), may be proportional to the pressure.

In some cases, the output ($V_{out}$) of the bridge circuit 14 may decrease with increasing temperature because of the temperature variation of the piezo-resistive coefficient of the semiconductor. In certain embodiments, compensation methods may be used that may be based on the fact that the temperature coefficient of the resistance of the bridge elements may be positive and may be greater in magnitude than the decrease with temperature of the piezo-resistive coefficient. Thus, when a terminal 24 of an impedance $Z_1$ is coupled to a terminal 26 of the bridge circuit 14, the resulting circuit is powered with a constant voltage ($V_{REF}$), the voltage ($V_b$) across the bridge circuit 14 may increase as a function of temperature and an output ($V_{out}$) more independent of temperature may result. In some cases, this temperature independence (decreased span error) may be limited to a temperature range of 0° C. to 85° C., for example. In some cases, combining the impedance $Z_1$ with a negative impedance circuit (e.g., negative impedance 12) with the bridge circuit 14 may enable a more temperature independent output ($V_{out}$) (decreased span error) across a greater range of temperatures, such as between −60° C. and 160° C., for example.

According to various embodiments, the negative impedance 12 may be coupled to the terminal 26 of the bridge circuit 14 and include an amplifier 18, a signal-adjusting circuit 20, and an amplifier circuit 22. In some cases, the amplifier 18 may be an operational-amplifier (op-amp) that includes a non-inverting input terminal 34 coupled to the terminal 26 of the bridge circuit 14, an inverting input terminal 36, and an output terminal 38. In some cases, the signal-adjusting circuit 20 may include an impedance Z2 with a terminal 40 coupled to the output terminal 38 of the amplifier 18 and a terminal 42 coupled to the terminal 26 of the bridge circuit 14.

In certain embodiments, the amplifier circuit 22 may include an impedance $Z_3$ with a terminal 44 coupled to the output terminal 38 of the amplifier 18. In some cases, the impedance $Z_3$ may include impedances $Z_4$, $Z_5$, and $Z_6$. In some cases, impedance $Z_4$ may have a terminal 52 coupled to the output terminal 38 of the amplifier 18 and a terminal 54 coupled to the inverting terminal 36 of the amplifier 18. In some cases, impedance $Z_5$ may have a terminal 56 coupled to the inverting input terminal 36 of the amplifier 18 and a terminal 58 coupled to a signal generating source ($V_{REF}$). In some cases, impedance $Z_6$ may have a terminal 60 coupled to the inverting input terminal 36 of the amplifier 18 and a terminal 62 coupled to ground 64.

Figure 1B:
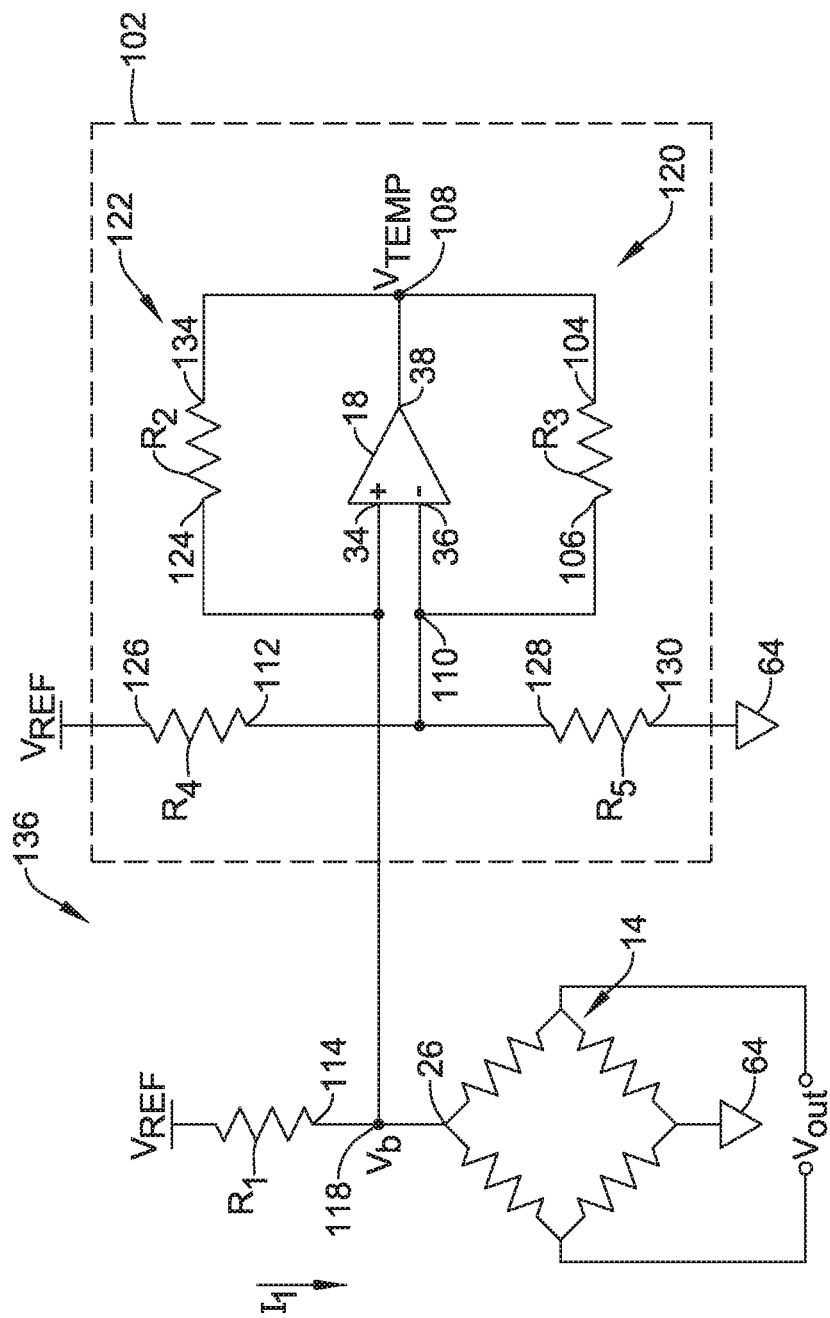
FIG. 1B depicts another exemplary device.

Turning to FIG. 1B, a compensation circuit 136 is depicted that may enable a more temperature independent output ($V_{out}$) across a range of temperatures, similar the device 10, from FIG. 1A. In some embodiments, as discussed above with respect to FIG. 1A, the bridge circuit 14 may be a piezo-resistive bridge circuit. In various embodiments, an impedance (i.e., resistor $R_1$) may have a terminal 114 coupled to the terminal 26 of the bridge circuit 14 at a terminal node 118.

As shown in FIG. 1B, the compensation circuit 136 may include a negative resistance 102. In certain embodiments, the negative resistance 102 may include the amplifier 18, a negative feedback loop 120, and a positive feedback loop 122. In some cases, the amplifier 18 may have its non-inverting input 34 coupled to the terminal node 118. In some cases, the negative feedback loop 120 may have an impedance that includes resistor $R_3$ and a voltage divider that includes resistors $R_4$ and $R_5$. In some cases, $R_3$ may have a terminal 104 coupled to the output terminal 38 of the amplifier 18 at an amplifier output node 108 and a terminal 106 coupled to the inverting input terminal 36 of the amplifier 18 at an inverting input node 110. In some cases, $R_4$ may have a terminal 112 coupled to the inverting input node 110 and a terminal 126 coupled to a signal generating source ($V_{REF}$). In some cases, $R_5$ may have a terminal 128 coupled to the inverting input node 110 and a terminal 130 coupled to ground 64. In certain embodiments, the positive feedback loop 122 may have an impedance that includes resistor $R_2$ that has a terminal 124 coupled to the terminal node 118 and a terminal 134 coupled to the amplifier output node 108.

According to various embodiments, the bridge circuit 14 may be operating at a certain temperature where the bridge voltage $V_b$ at the terminal node 118 may be equal to the voltage of the divider formed by $R_4$ and $R_5$ at the inverting input node 110. As such, the output ($V_{TEMP}$) may also be equal to $V_b$ at the amplifier output node 108. At this neutral condition the voltage across $R_2$ may be zero, thus the current across $R_2$ may be zero. As a result, $R_2$ may neither add nor subtract any excitation from what $R_1$ supplies to the bridge circuit 14. If or when the bridge circuit 14 begins operating at an increased temperature, the bridge circuit 14 resistance may increase. In this case, $V_b$ may increase such that it is greater than the voltage of the divider formed by $R_4$ and $R_5$ at the inverting input node 110. As such, $V_{TEMP}$ may increase by the closed loop gain of the amplifier. In some cases, the amplifier gain may be set by $R_3$ divided by the parallel combination of $R_4$ and $R_5$. This gain may range between 0.5 and 5 (e.g., 1.5), for example. In this increased temperature condition, $V_{TEMP}$ may be higher than $V_b$. As such, the voltage across $R_2$ may result in a current from the amplifier output node 108 to the terminal node 118, which adds to $I_1$ (the excitation from $R_1$), and further increases the bridge excitation voltage. If or when the bridge circuit 14 begins operating at a decreased temperature, the bridge circuit 14 resistance may decrease. In this case, $V_b$ may decrease such that it is less than the voltage of the divider formed by $R_4$ and $R_5$ at the inverting input node 110. As such, $V_{TEMP}$ may decrease. In this decreased temperature condition, $V_{TEMP}$ may be less than $V_b$. As such, the voltage across $R_2$ may result in a current from the terminal node 118 to the amplifier output node 108, decreasing the current to bridge circuit 14, subtracting from the excitation from $R_1$, and further decreasing the bridge excitation voltage.

Figure 1C:
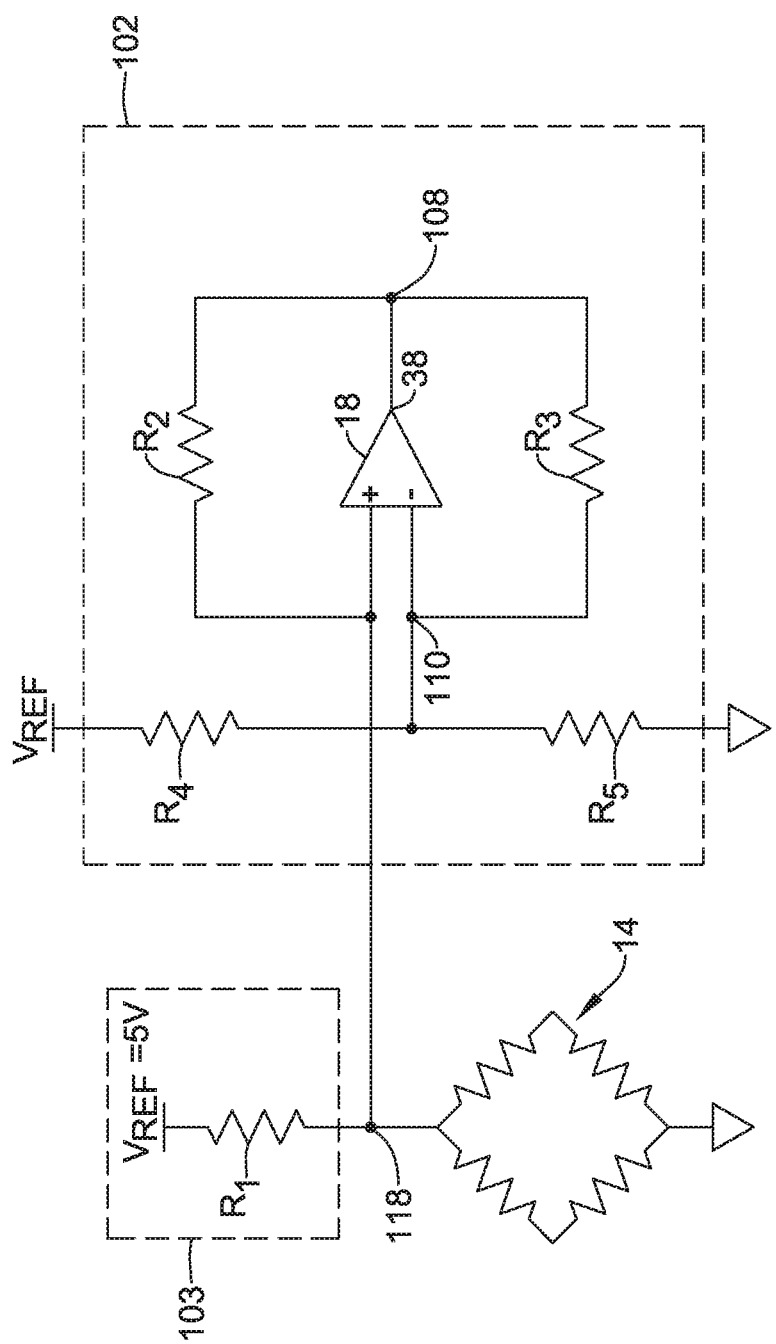
FIGS. 1C-1H depict an exemplary operation of the device.

FIG. 1C depicts the compensation circuit 136 of FIG. 1B with typical circuit values. The compensation circuit 136 may be divided into 3 parts, the positive resistance and source 103, the negative resistance and source 102 and the bridge 14. In this example, $V_{REF}$=5V, $R_1$=4 kΩ, $R_{2=10}$ kΩ, $R_{3=16}$ kΩ, $R_{4=32}$ kΩ, and $R_{5=18}$ kΩ. In this example, the closed loop voltage gain of the amplifier is computed as gain=$R_3(1/R_4+1/R_5)$=1.3889.

Figure 1D:
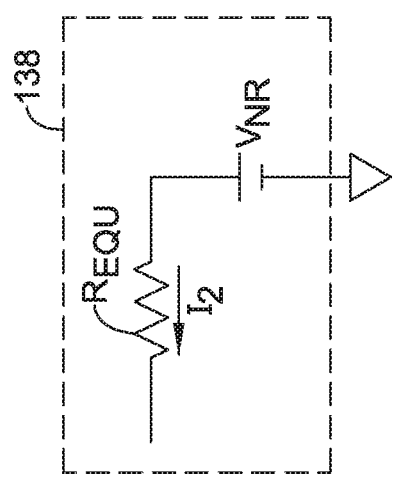

FIG. 1D depicts an equivalent circuit 138 for the negative resistance and source 102. As shown, the equivalent circuit 138 includes a negative resistor $R_{EQU}$ and a voltage source $V_{NR}$. The value of the negative resistor, $R_{EQU}$ is computed by the following equation. $R_{EQU}$=$-1*R_2$/gain=$-1*10000/1.3889$=$-7200$ ohms. Note that the value of $R_{EQU}$ is less than zero, and the negative sign must be carried through subsequent computations. $V_{NR}$ is the open circuit voltage where the current $I_2$ is zero. In this example, $V_{NR}$ is equal to the voltage divider formed by $R_4$ and $R_5$ from FIG. 1C, thus $V_{NR}$=$R_4/(R_4+R_5)$=1.8 volts for this example.

Figure 1E:
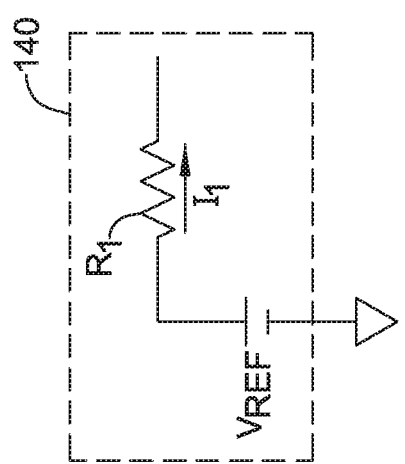
Figure 1F:
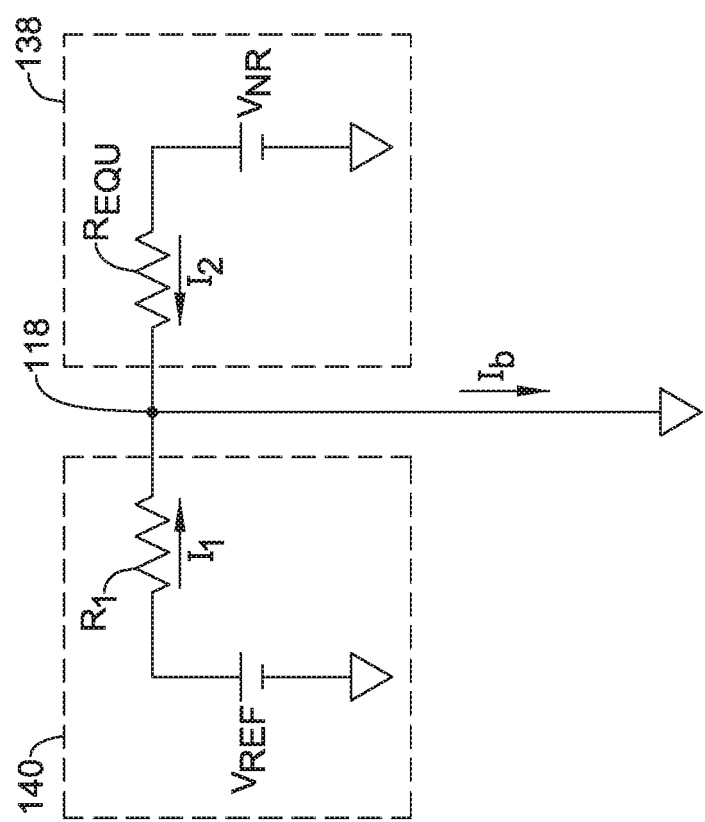

FIG. 1E depicts and equivalent circuit 140 for the positive resistor and source, 103. FIG. 1F depicts both circuits 138 and 140 driving a short circuit 105. For this short circuit condition of the equivalent circuit 138 for the negative resistance and source 102, $I_2$=$V_{NR}/R_{EQU}$=$1.8/-7200$=$-0.00025$ amperes. The combined current $I_b$ is $I_b$=$I_1$+$I_2$=0.00125+($-0.00025$)=0.00100 amperes.

Figure 1G:
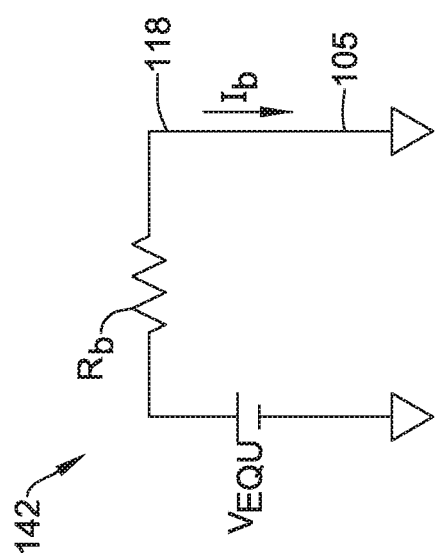
Figure 1H:
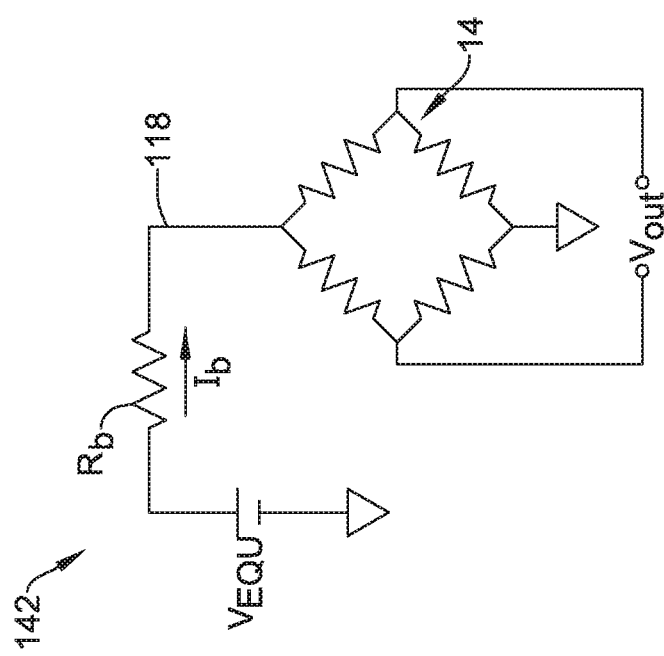

FIG. 1G depicts an equivalent combined circuit 142 for the equivalent circuit 138 and 140 (from FIG. 1F). $R_b$ is the parallel combination of $R_1$ and $R_{EQU}$. Thus $R_b$=$(R_1*R_{EQU})/(R_1+R_{EQU})$=$4000*(-7200)/(4000+(-7200))$=$-28800000/-3200$=9000 ohms. The source voltage for the negative resistor and source is $V_{EQU}$. $V_{EQU}$ is computed from the resistance and short circuit current. $V_{EQU}$=$I_b*R_b$=$0.001*9000$=9V. FIG. 1H shows the equivalent circuit 142 driving the bridge, 14. As the resistance of the bridge 14 varies with temperature, the current $I_b$ may be readily computed from $V_{EQU}$ and $R_b$. Note that the equivalent source voltage ($V_{EQU}$) is 9V which is greater than the source voltage ($V_{REF}$ from FIG. 1C) of 5V. This circuit may not supply more voltage than the 5V supply, but for expected values of the bridge resistance, this circuit may provide bridge excitation according to $V_{EQU}$ and $R_b$.

Figure 2:
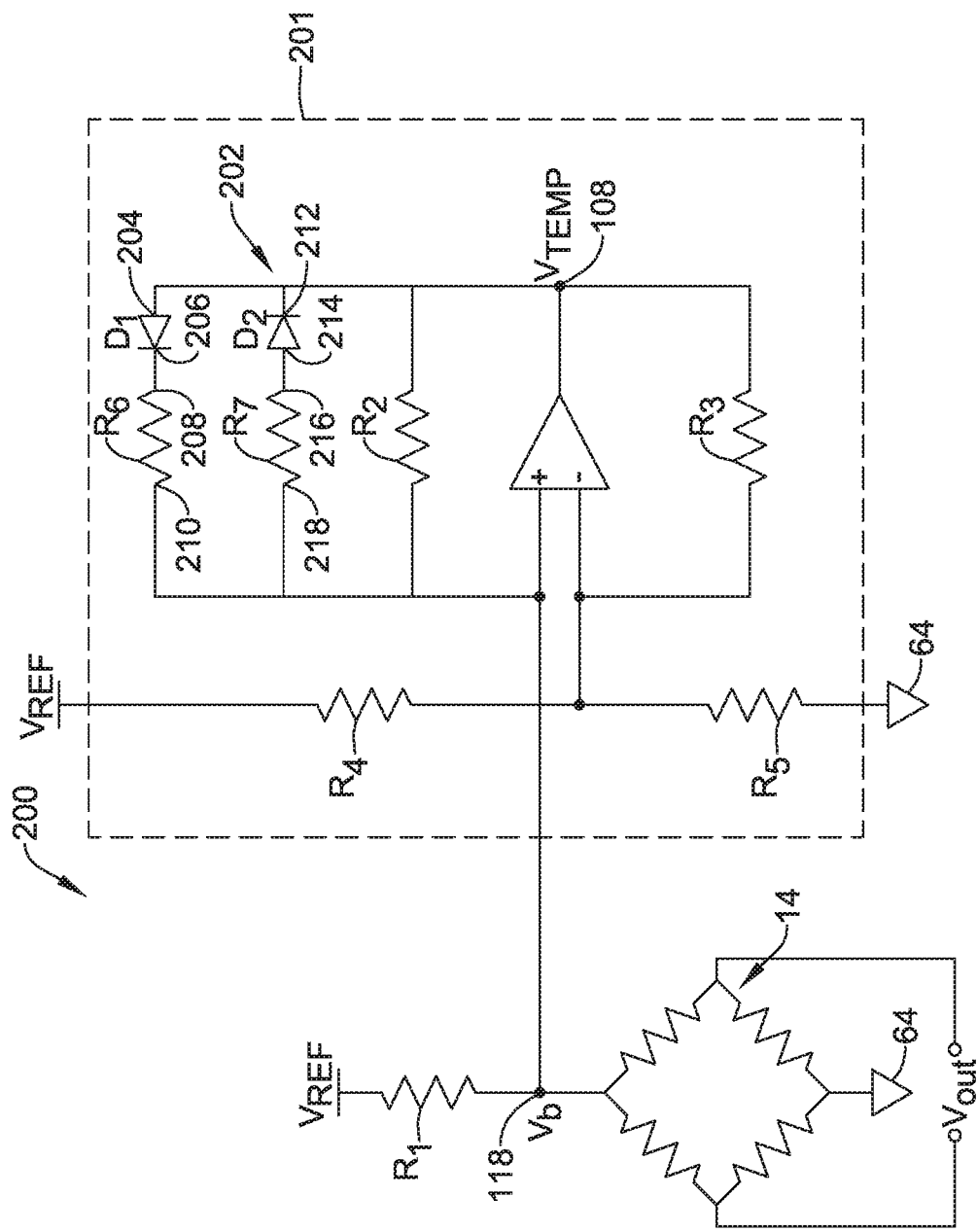
FIG. 2 depicts another exemplary device.

FIG. 2 depicts another compensation circuit 200 that may enable a more temperature independent output ($V_{out}$) across a range of temperatures, similar to the compensation circuit 136, from FIG. 1B. In various embodiments, the compensation circuit 200 may include a negative resistance 201 that is configured similar to the negative resistance 102, from FIG. 1B. In addition, the negative resistance 201 may have a positive feedback loop 202 that also includes two impedances in parallel with $R_2$. In some cases, one of the impedances includes a diode $D_1$ having an anode end 204 coupled to the amplifier output node 108 and resistor $R_6$ having a terminal 208 coupled to a cathode end 206 of $D_1$ and a terminal 210 coupled to the terminal node 118. In some cases, the bridge circuit 14 may be operating at an increased temperature and the difference between $V_{TEMP}$ and $V_b$ may exceed a forward threshold voltage of $D_1$. In some cases, the forward threshold voltage may range from 0.1V to 1V. For instance, the forward threshold voltage of $D_1$ may be 0.7V. Accordingly, $D_1$ may begin to conduct and allow current to flow from the amplifier output node 108 through the resistor $R_6$, to the terminal node 118. The conduction of $D_1$ may be gradual. As such, as the difference between $V_{TEMP}$ and $V_b$ increases, the current through $D_1$ may increase, and apply increasing amounts of non-linear compensation. This gradual conduction of $D_1$ may match the gradual need for more compensation of the bridge circuit 14. With careful selection of resistor values (e.g., resistor values of $R_1$, $R_2$, $R_3$, $R_4$, $R_5$, etc.), this matching may enable the compensation circuit 200 to achieve better than +/−0.2 percent span error of the bridge circuit 14 output signal ($V_{out}$).

In addition, in some cases, the other impedance of the positive feedback loop 202 may include a diode $D_2$ having a cathode end 212 coupled to the amplifier output node 108 and a resistor $R_7$ having a terminal 216 coupled to an anode end 214 of $D_2$ and a terminal 218 coupled to the terminal node 118. In some cases, the bridge circuit 14 may be operating at a decreased temperature and the difference between $V_b$ and $V_{TEMP}$ may exceed a forward threshold voltage of $D_2$. Similar to $D_1$, in some cases, the forward threshold voltage of $D_2$ may range from 0.1V to 1V. For instance, the forward threshold voltage of $D_2$ may also be 0.7V. Accordingly, $D_2$ may begin to conduct and allow current to flow from the terminal node 118 through $R_7$ to the amplifier output node 108. Similar to $D_1$, the conduction of $D_2$ may be gradual. As such, as the difference between $V_b$ and $V_{TEMP}$ increases, the current through $D_2$ may increase, and apply decreasing amounts of non-linear compensation. This gradual conduction of $D_2$ may match the gradual need for less compensation of the bridge circuit 14. With careful selection of resistor values (e.g., resistor values of $R_1$, $R_2$, $R_3$, $R_4$, $R_5$, etc.), this matching may enable the compensation circuit 200 to achieve better than +/−0.2 percent span error of the bridge circuit 14 output signal ($V_{out}$).

Suitable diodes must have a repeatable forward conduction characteristic and have low leakage. Examples of commercially available low leakage types include 1SS307 (Toshiba), CMPD6001S (Central Semiconductor), BAS 116V (Diodes, incorporated) and BAV199WQ (Diodes, incorporated).

Figure 3A:
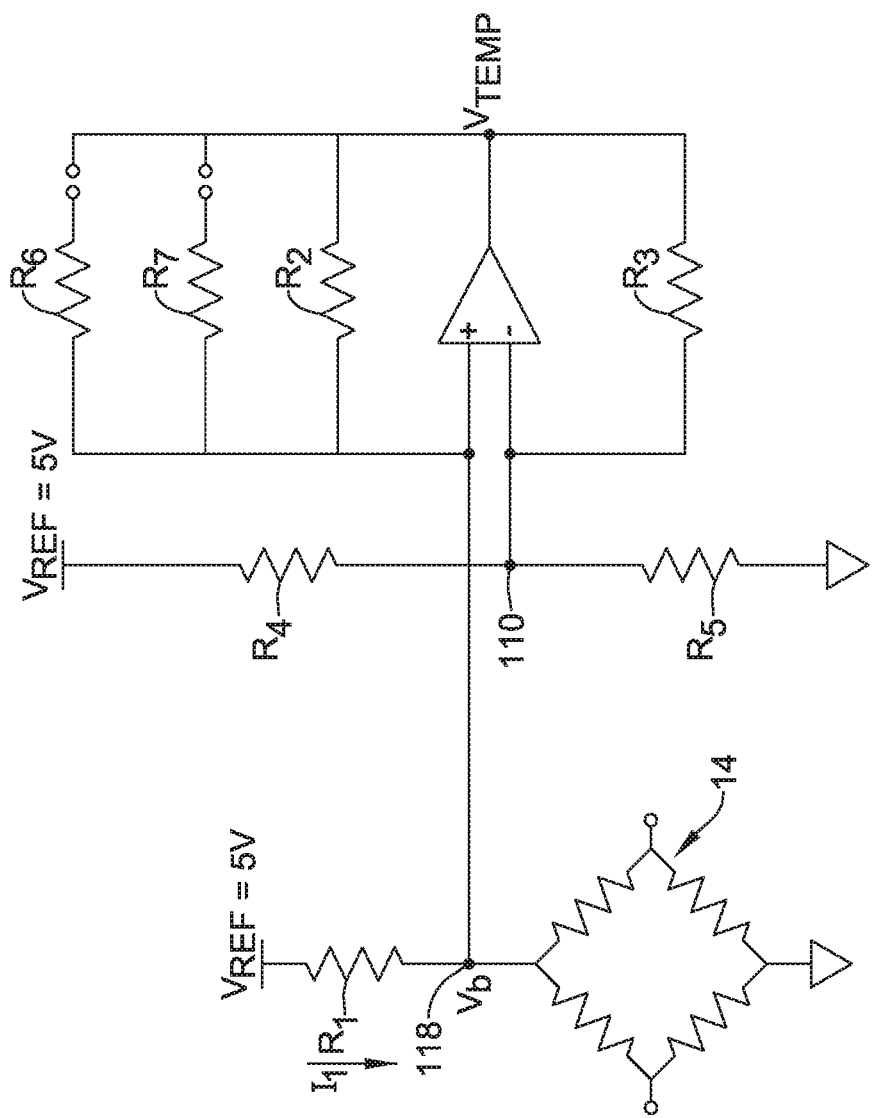
FIGS. 3A-3C depict an exemplary operation of the device.
Figure 3B:
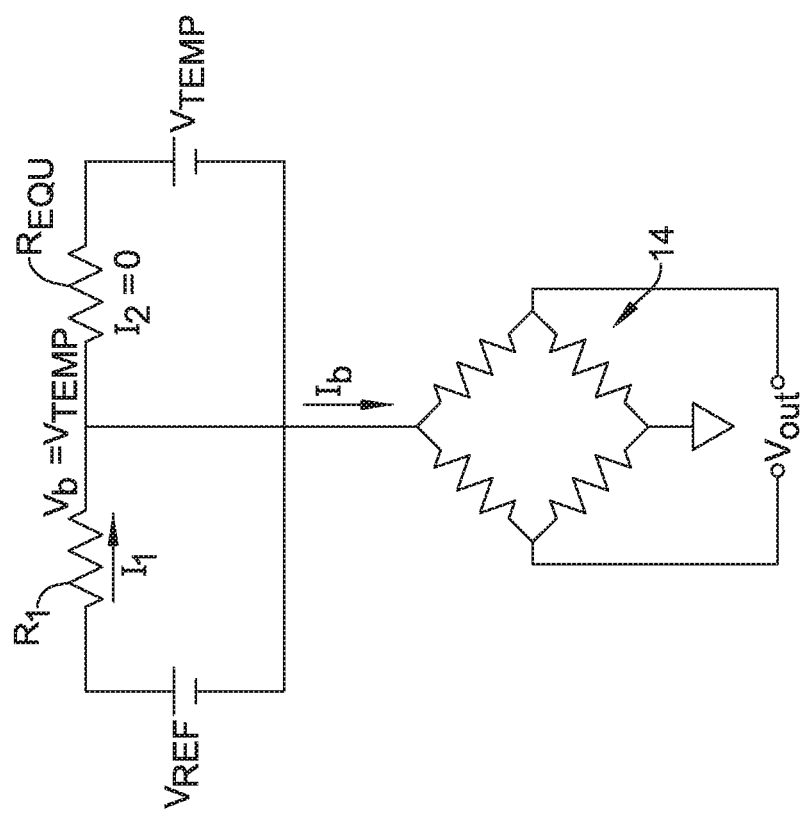
Figure 3C:
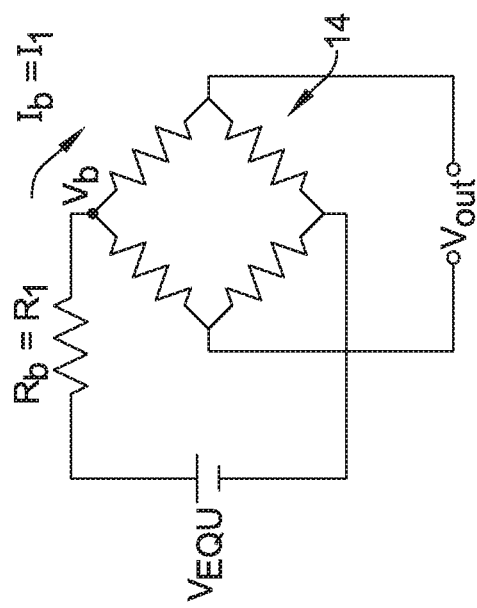

FIGS. 3A-3C depict the operation of the compensation circuit 200 when the bridge circuit 14 is operating in the normal temperature range (e.g., between 0° C. and 85° C.). In this example, $V_{REF}$ is a signal generating source and $I_1$ flows through $R_1$. While operating in the normal temperature range, the bridge voltage $V_b$ at the terminal node 118 may be equal to the voltage of the divider formed by $R_4$ and $R_5$ at the inverting input node 110. As such, the $V_{TEMP}$ may also be equal to $V_b$ at the amplifier output node 108. At this condition the voltage across $R_2$ may be zero. Accordingly, the difference between $V_{TEMP}$ and $V_b$ is neither great enough to exceed the forward threshold voltage of $D_1$ nor the forward threshold voltage of $D_2$. Therefore, $D_1$ may not allow current to flow through $R_6$ and $D_2$ may not allow current to flow $R_7$ (both $D_1$ and $D_2$ are shown as open circuits in FIG. 3A to illustrate that no current will flow through their respective branches). As such, turning to FIG. 3B, the only current that flows will have to flow through $R_2$ ($R_{EQU}=R_2$, as shown in FIG. 3B). However, since $V_{TEMP}$ is equal to $V_b$, 0V may be dropped across $R_2$ and the current across $R_2$ ($I_2$) may be zero. As a result, turning to FIG. 3C, the equivalent circuit for the circuit in FIG. 3A is shown. As can be seen, $R_2$ may neither add nor subtract any excitation from what $R_1$ supplies to the bridge circuit 14. Thus, $R_b$ may be equal to $R_1$ and $I_b$ may be equal to $I_1$.

Figure 4A:
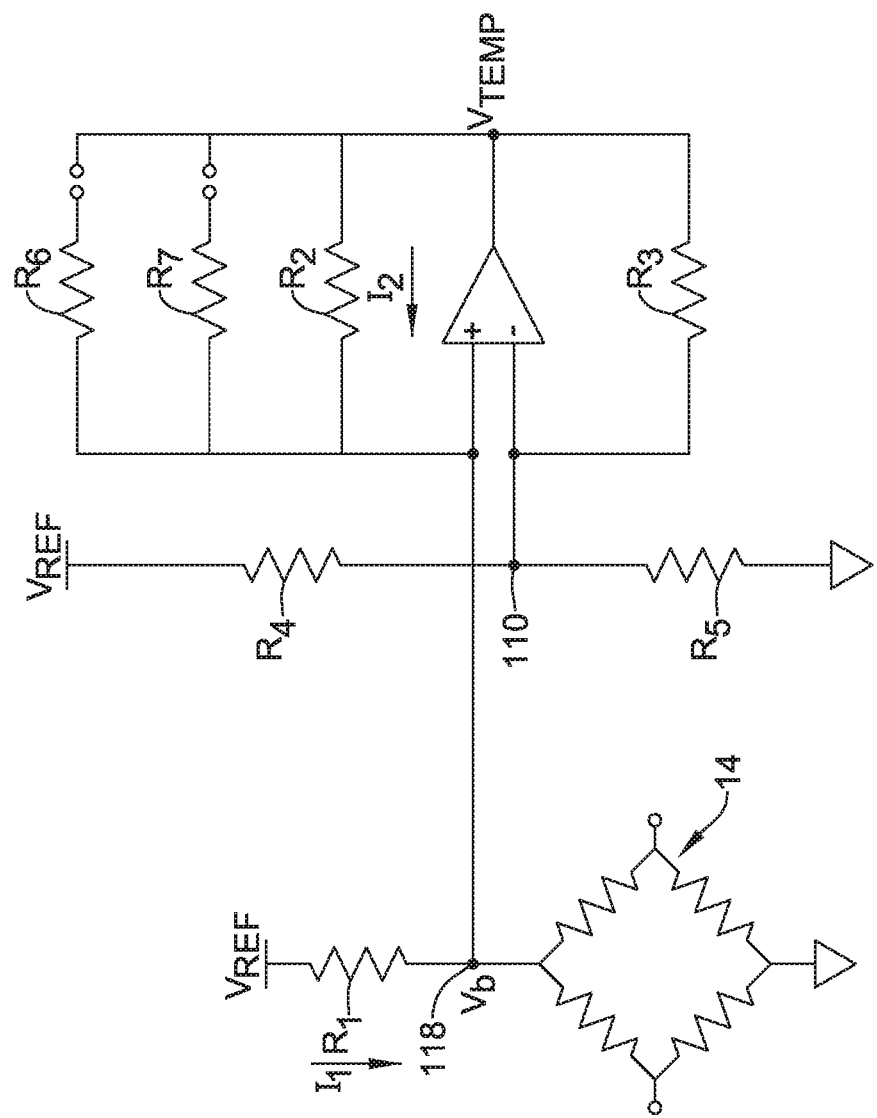
FIGS. 4A-4C depict another exemplary operation of the device.
Figure 4B:
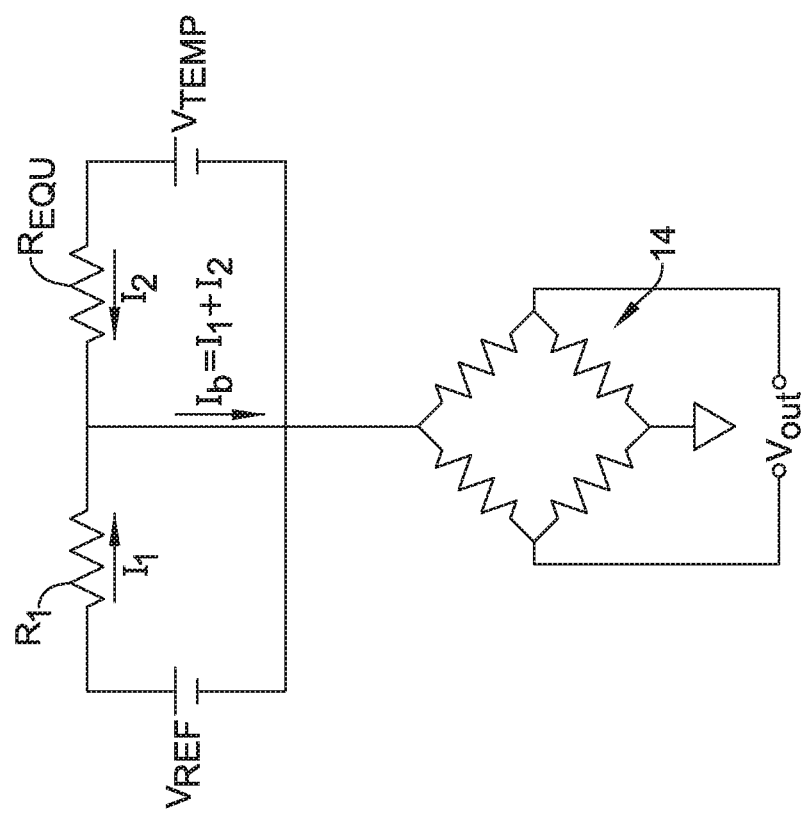
Figure 4C:
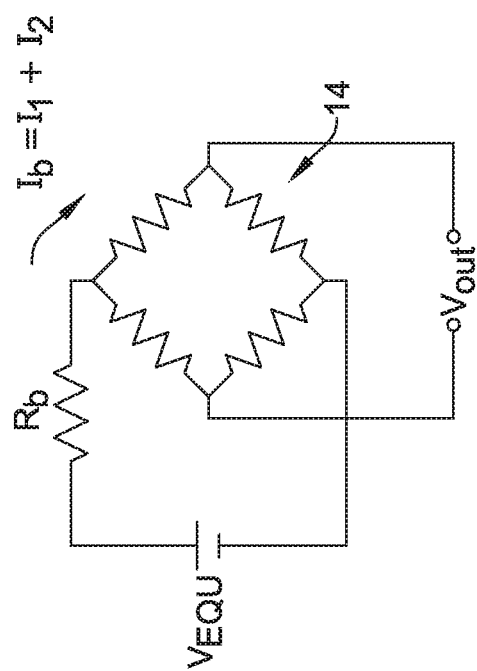

FIGS. 4A-4C depict the operation of the compensation circuit 200 when the bridge circuit 14 is operating in the increased temperature range (e.g., greater than 85° C.). Once again, in this example, $V_{REF}$ is a source voltage and $I_1$ flows through $R_1$. While operating in the increased temperature range, the bridge circuit 14 resistance may increase. Accordingly, $V_b$ may increase such that it is greater than the voltage of the divider formed by $R_4$ and $R_5$ at the inverting input node 110. As such, $V_{TEMP}$ may increase by the closed loop gain of the amplifier. In this example, the closed loop gain of the amplifier may be equal to 1.5 (gain=1.5). In this increased temperature condition, $V_{TEMP}$ may be higher than $V_b$. As such, the voltage across $R_2$ may result in a current ($I_2$) from the amplifier output node 108 to the terminal node 118. However, the difference between $V_{TEMP}$ and $V_b$ may not be great enough to exceed the forward threshold voltage of $D_1$. Therefore, $D_1$ may not allow current to flow through $R_6$ and $D_2$ may not allow current to flow $R_7$ (both $D_1$ and $D_2$ are shown as open circuits in FIG. 4A to illustrate that no current will flow through their respective branches). As such, turning to FIG. 4B, $I_2$ only flows through $R_2$, thus, $R_{EQU}=-1*R_2/\text{gain}=-1*R_2/(R_3*(1/R_{4+1}/R_5)$. As can be seen, because $I_2$ flows from the amplifier output node 108 to the terminal node 118 when $V_{TEMP}>V_b$, $R_{EQU}$ may comprise a negative resistance that is effectively in parallel with $R_1$. Therefore, $I_2$ may add to $I_1$, adding to the excitation from $R_1$, and further increasing the bridge excitation as if the source voltage is $V_{EQU}$, which may be greater than $V_{REF}$. As a result, turning to FIG. 4C, the equivalent circuit for the circuit in FIG. 4A is shown. As can be seen, $I_b$ may be equal to $I_1+I2$ and $R_b$ may be greater than $R_1$.

Figure 4D:
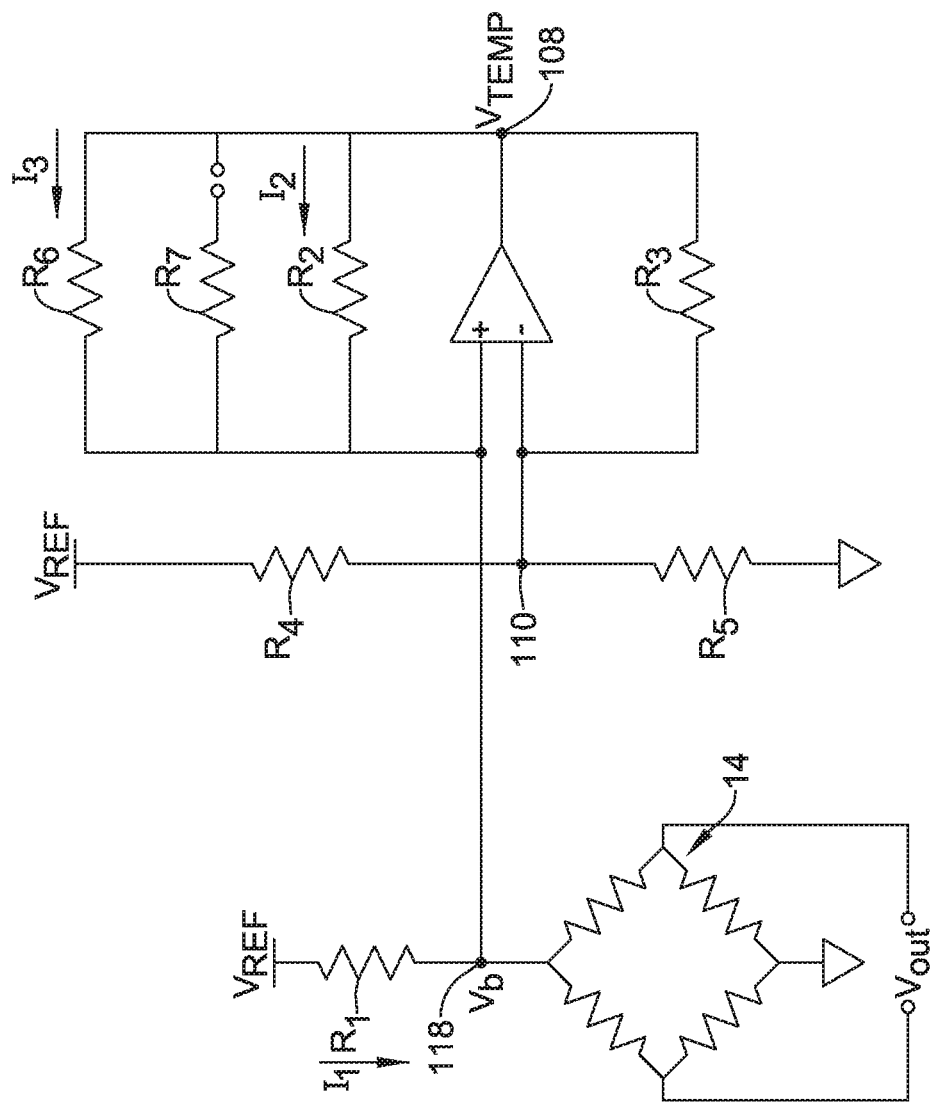
FIGS. 4D-4F depict another exemplary operation of the device.
Figure 4E:
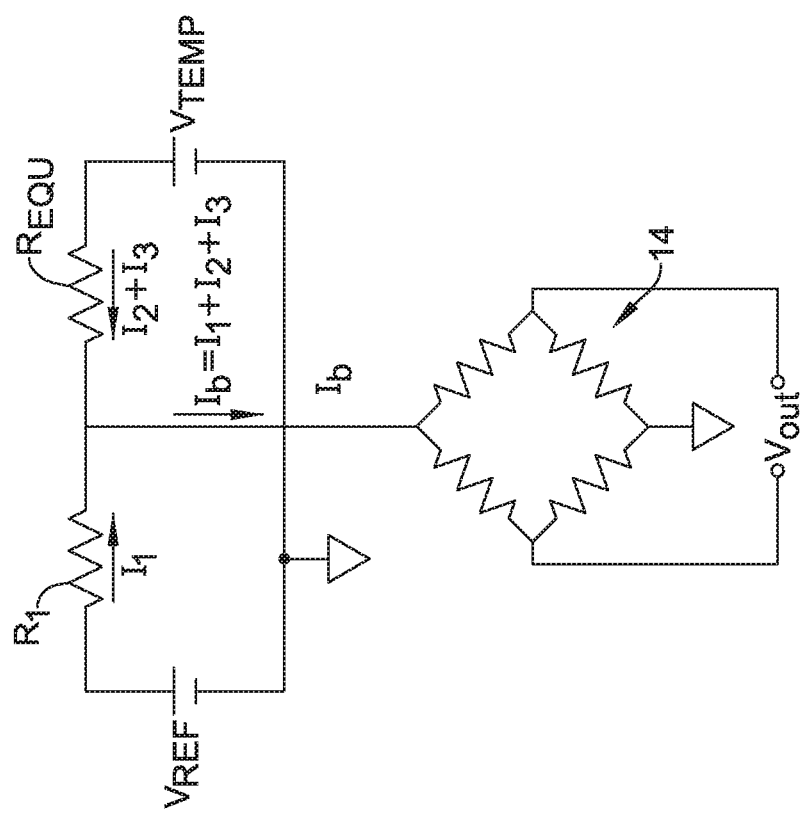
Figure 4F:
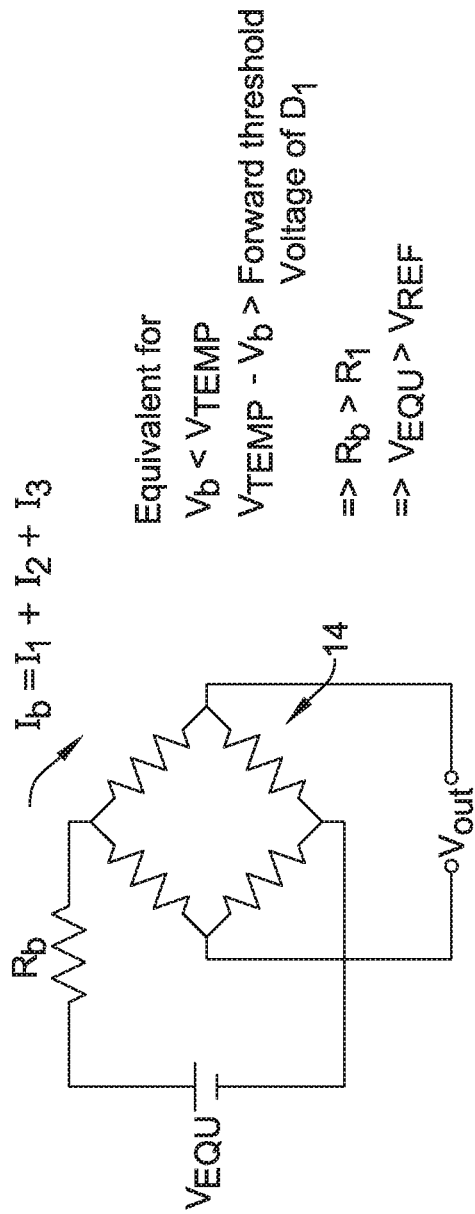

Turning to FIG. 4D, in some cases, when the bridge circuit 14 is operating at an increased temperature and the difference between $V_{TEMP}$ and $V_b$ exceeds the forward threshold voltage of $D_1$, $D_1$ may begin to conduct and allow current ($I_3$) to flow from the amplifier output node 108 through the resistor $R_6$, to the terminal node 118 in addition to the current $I_2$ already flowing from the amplifier output node 108 through $R_2$ to the terminal node 118. Diode $D_1$ has an equivalent resistance at a particular current and temperature denoted as $R_{D1}$ which is $V_{D1}/I_{D1}$. As such, turning to FIG. 4E, $R_{EQU}=-1*(R_2*(R_6+R_{D1}))/(R_2+R_6+R_{D1})*1/\text{gain})=-1*((R_2*(R_6+R_{D1}))/(R_2+R_6+R_{D1}))*1/(R_3*(1/R_{4+1}/R_5))$. As can be seen, because $I_2$ and 13 flow from the amplifier output node 108 to the terminal node 118 when $V_{TEMP}>V_b$ and $V_{TEMP}-V_b>$the forward threshold voltage of $D_1$, $R_{EQU}$ may comprise a negative resistance that is effectively in parallel with $R_1$. Therefore, $I_2$ and $I_3$ may add to $I_1$, adding to the excitation from $R_1$, and further increasing the bridge excitation as if the source voltage is $V_{EQU}$, which may be greater than $V_{REF}$. As a result, turning to FIG. 4F, the equivalent circuit for the circuit in FIG. 4D is shown. $R_b$ is the parallel combination of $R_{EQU}$ and $R_1$. As can be seen, $I_b$ may be equal to $I_1+I_2+I_3$ and $R_b$ may be greater than $R_1$.

Figure 5A:
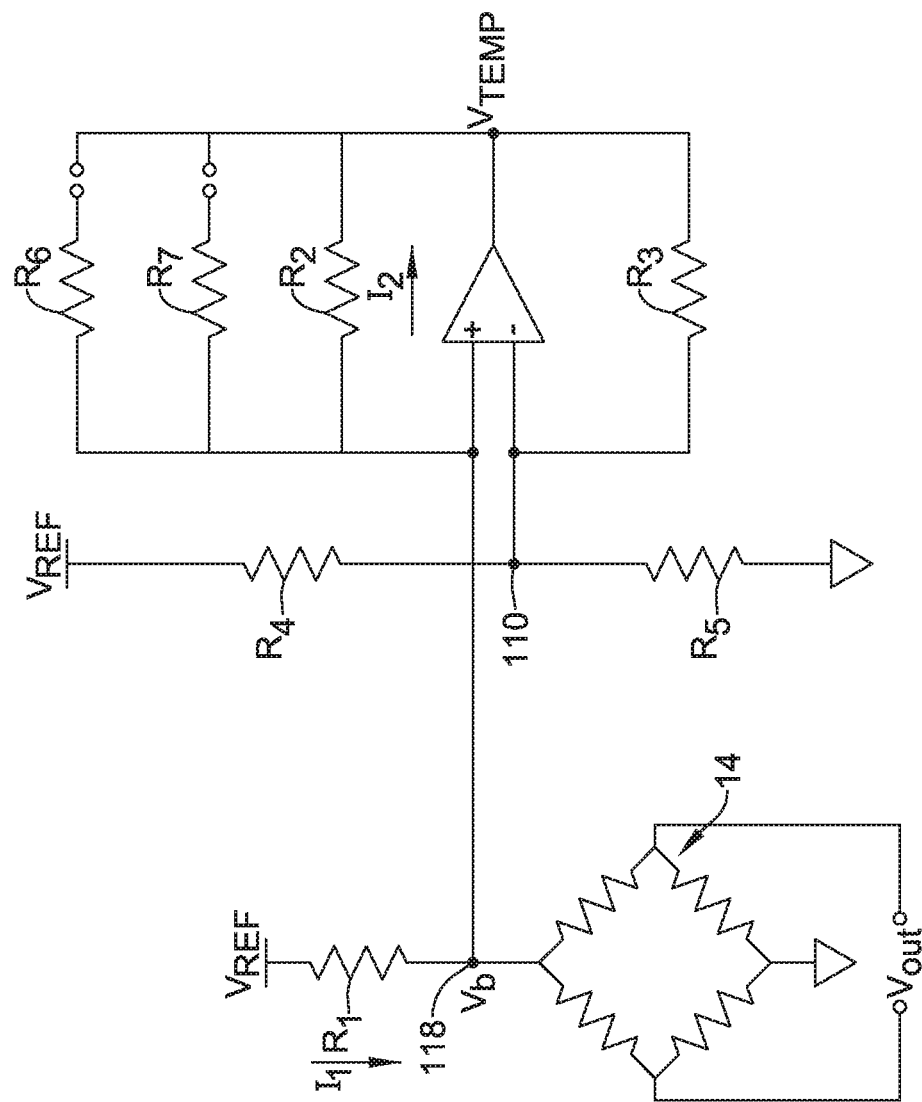
FIGS. 5A-5C depict another exemplary operation of the device.
Figure 5B:
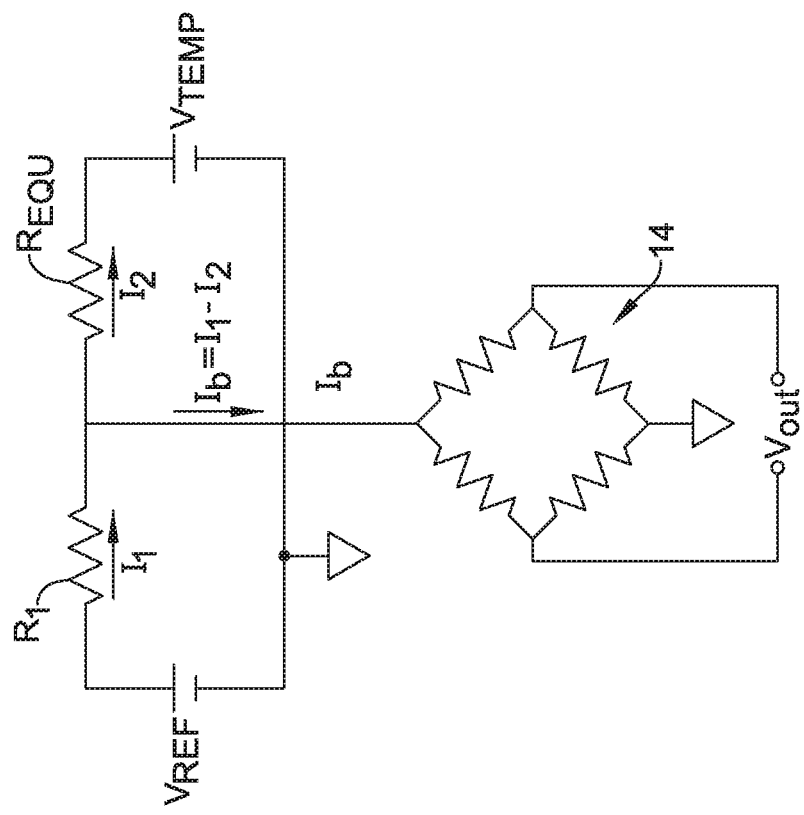
Figure 5C:
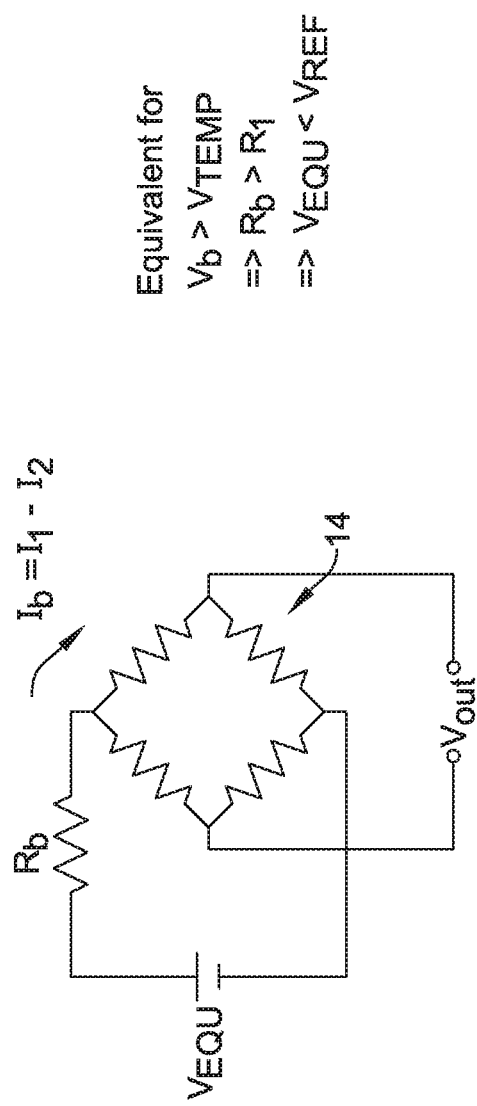

FIGS. 5A-5C depict the operation of the compensation circuit 200 when the bridge circuit 14 is operating in the decreased temperature range (e.g., less than 0° C.). Once again, in this example, $V_{REF}$ is a signal source generator and $I_1$ flows through $R_1$. While operating in the decreased temperature range, the bridge circuit 14 resistance may decrease. Accordingly, $V_b$ may decrease such that it is less than the voltage of the divider formed by $R_4$ and $R_5$ at the inverting input node 110. As such, $V_{TEMP}$ may decrease by the closed loop gain of the amplifier (gain=1.5). In this decreased temperature condition, $V_{TEMP}$ may be less than $V_b$. As such, the voltage across $R_2$ may result in a current $I_2$ from the terminal node 118 to the amplifier output node 108. However, the difference between $V_{TEMP}$ and $V_b$ and $V_{TEMP}$ may not be great enough to exceed the forward threshold voltage of $D_2$. Therefore, $D_1$ may not allow current to flow through $R_6$ and $D_2$ may not allow current to flow $R_7$ (both $D_1$ and $D_2$ are shown as open circuits in FIG. 5A to illustrate that no current will flow through their respective branches). As such, turning to FIG. 5B, $I_2$ only flows through $R_2$, thus, $R_{EQU}=1*R_2/gain=1*R_2/(R_3*(1/R_{4+1}/R_5))$. As can be seen, because 12 flows from the terminal node 118 to the amplifier output node 108 when $V_b>V_{TEMP}$, $R_{EQU}$ may comprise a resistance that is effectively in parallel with $R_1$. Therefore, $I_2$ may subtract from $I_1$, subtracting from the excitation from $R_1$, and further decreasing the bridge excitation as if the source voltage is $V_{EQU}$ which may be less than $V_{REF}$. As a result, turning to FIG. 5C, the equivalent circuit for the circuit in FIG. 5A is shown. As can be seen, $I_b$ may be equal to $I_1-I_2$ and $R_b$ may be greater than $R_1$.

Figure 5D:
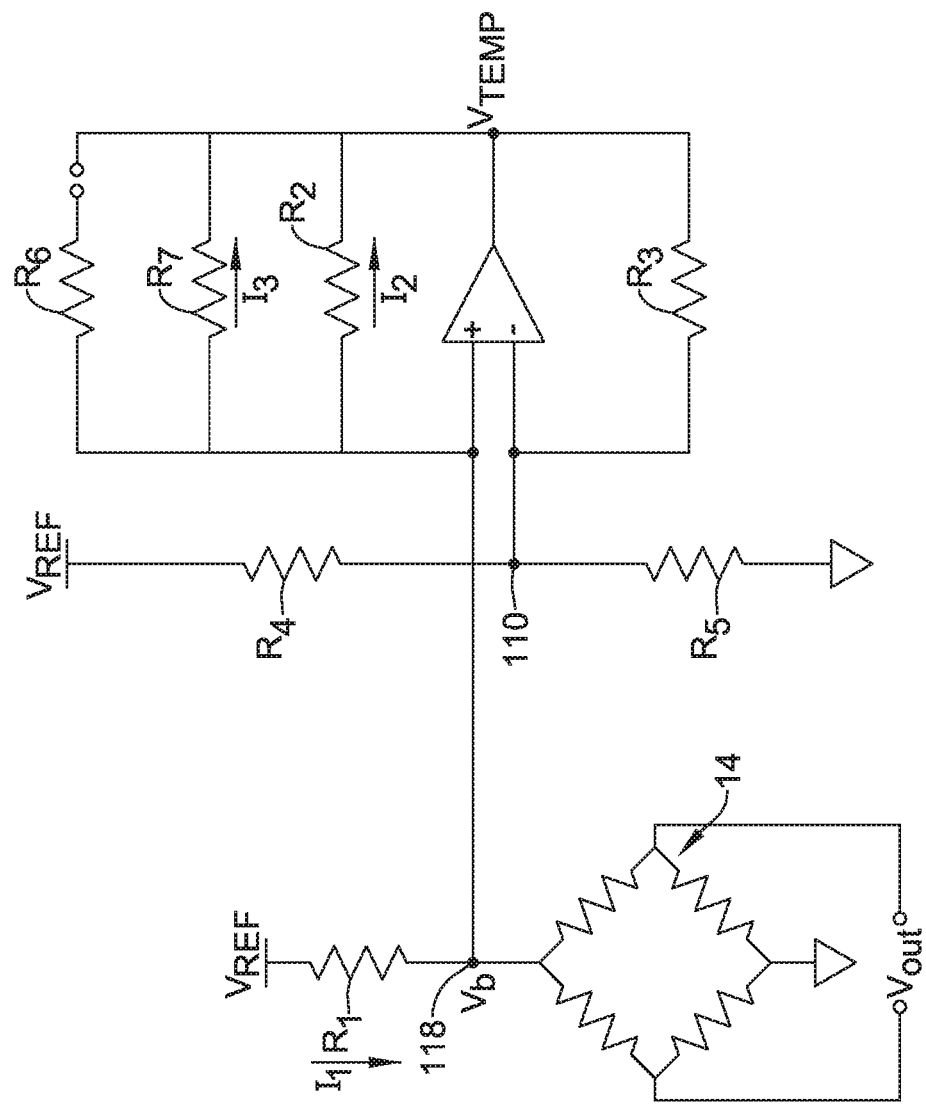
FIGS. 5D-5F depict another exemplary operation of the device.
Figure 5E:
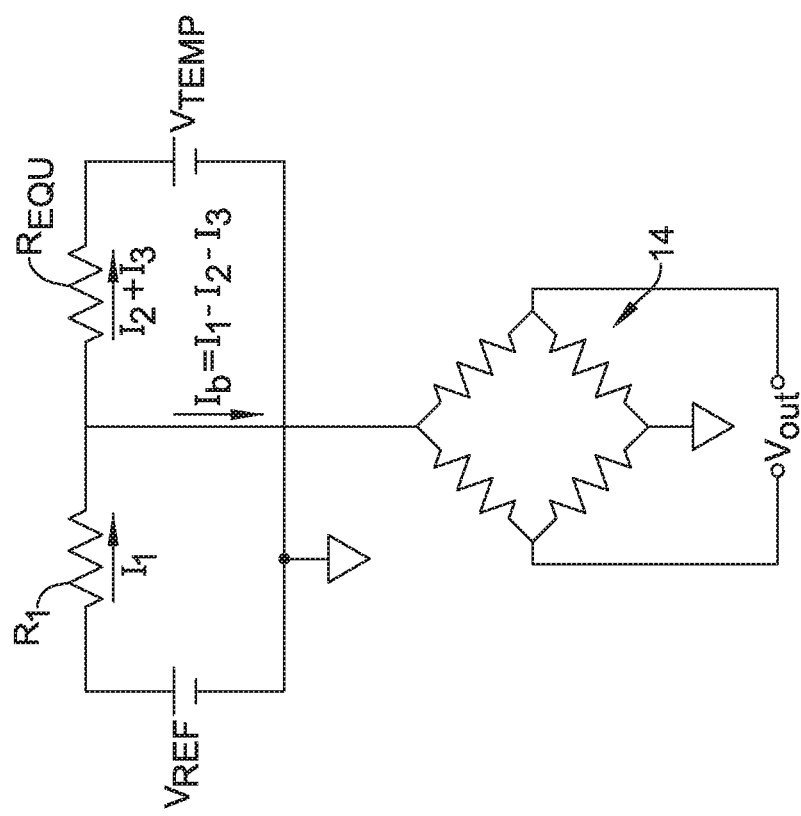
Figure 5F:
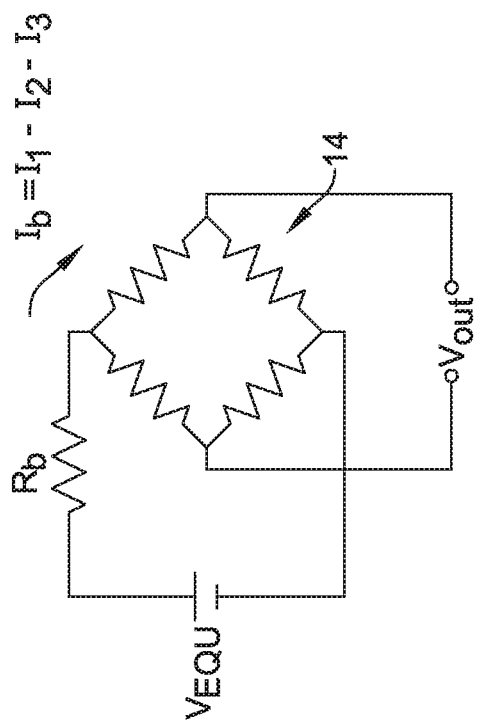

Turning to FIGS. 5D-5F, in some cases, when the bridge circuit 14 is operating at a decreased temperature and the difference between $V_b$ and $V_{TEMP}$ exceeds a forward threshold voltage of $D_2$, $D_2$ may begin to conduct and allow current $I_3$ to flow from the terminal node 118 through the resistor $R_7$, to the amplifier output node 108 in addition to the current $I_2$ already flowing from the terminal node 118 through $R_2$ to the amplifier output node 108. As such, turning to FIG. 5E, $R_{EQU}=-1*(R_2*(R_7+R_{D2}))/(R_2+R_7+RD2)*1/gain)=-1*((R_2*(R_7+R_{D2})/(R_2+R_7+R_{D2}))*1/(R_3*(1/R_{4+1}/R_5))$. As can be seen, because $I_2$ and $I_3$ flow from the terminal node 118 to the amplifier output node 108 when $V_b>V_{TEMP}$ and $V_b-V_{TEMP}>$the forward threshold voltage of $D_2$, $R_{EQU}$ may comprise a resistance that is effectively in parallel with $R_1$. Therefore, $I_2$ and $I_3$ may subtract from $I_1$, subtracting from the excitation from $R_1$, and further decreasing the bridge excitation as if the source voltage is $V_{EQU}$, which may be less than $V_{REF}$. As a result, turning to FIG. 5F, the equivalent circuit for the circuit in FIG. 5D is shown. As can be seen, $I_b$ may be equal to $I_1-I_2-I_3$. $R_b$ is the parallel combination $R_{EQU}$ and $R_2$. $R_b$ may be greater than $R_1$.

Figure 6:
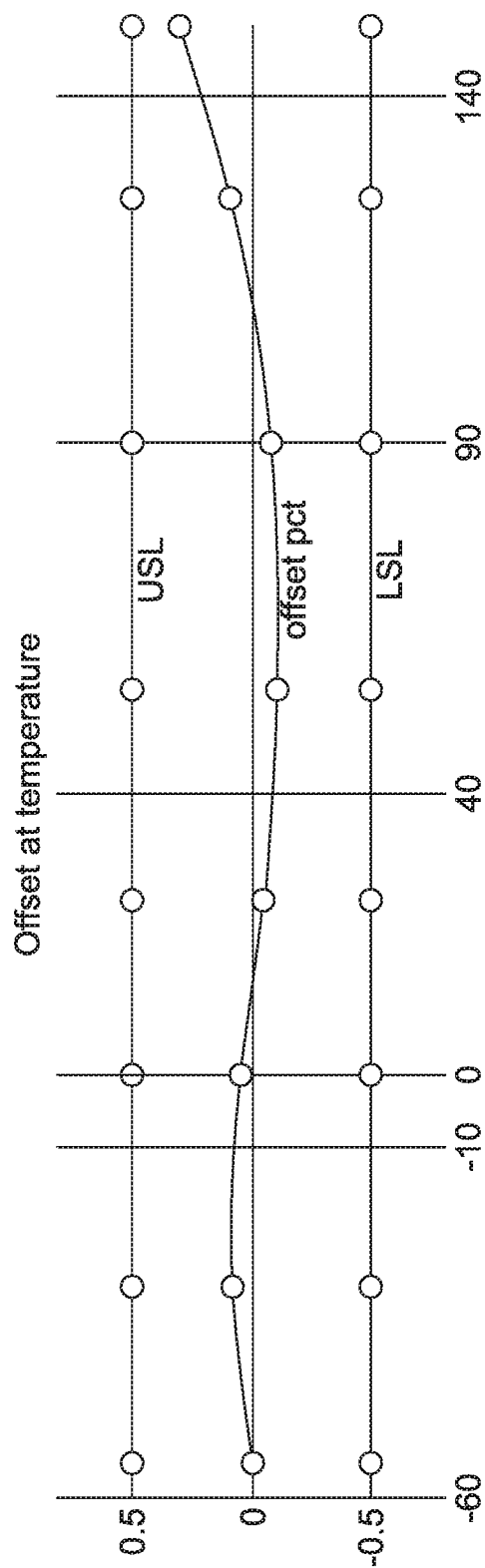
FIG. 6 is an example of a sensor offset signal.

Another useful feature of this method of compensation is the temperature signal, $V_{TEMP}$. The temperature signal is made more linear with respect to temperature by the non-linear positive feedback elements. Thus when a constant bridge output ($V_{OUT}$) over temperature is achieved using the non-linear feedback elements, the temperature signal will then be highly linear over temperature. Because this signal comes from a closed loop amplifier, it is of low impedance and is useful for correcting sensor offset errors that vary with temperature. FIG. 6 gives an example of a sensor offset signal that has been optimized for a minimum offset error over the temperature range by summing small portions of the temperature signal ($V_{TEMP}$) and the fixed reference ($V_{REF}$) with the bridge output.

Figure 7:
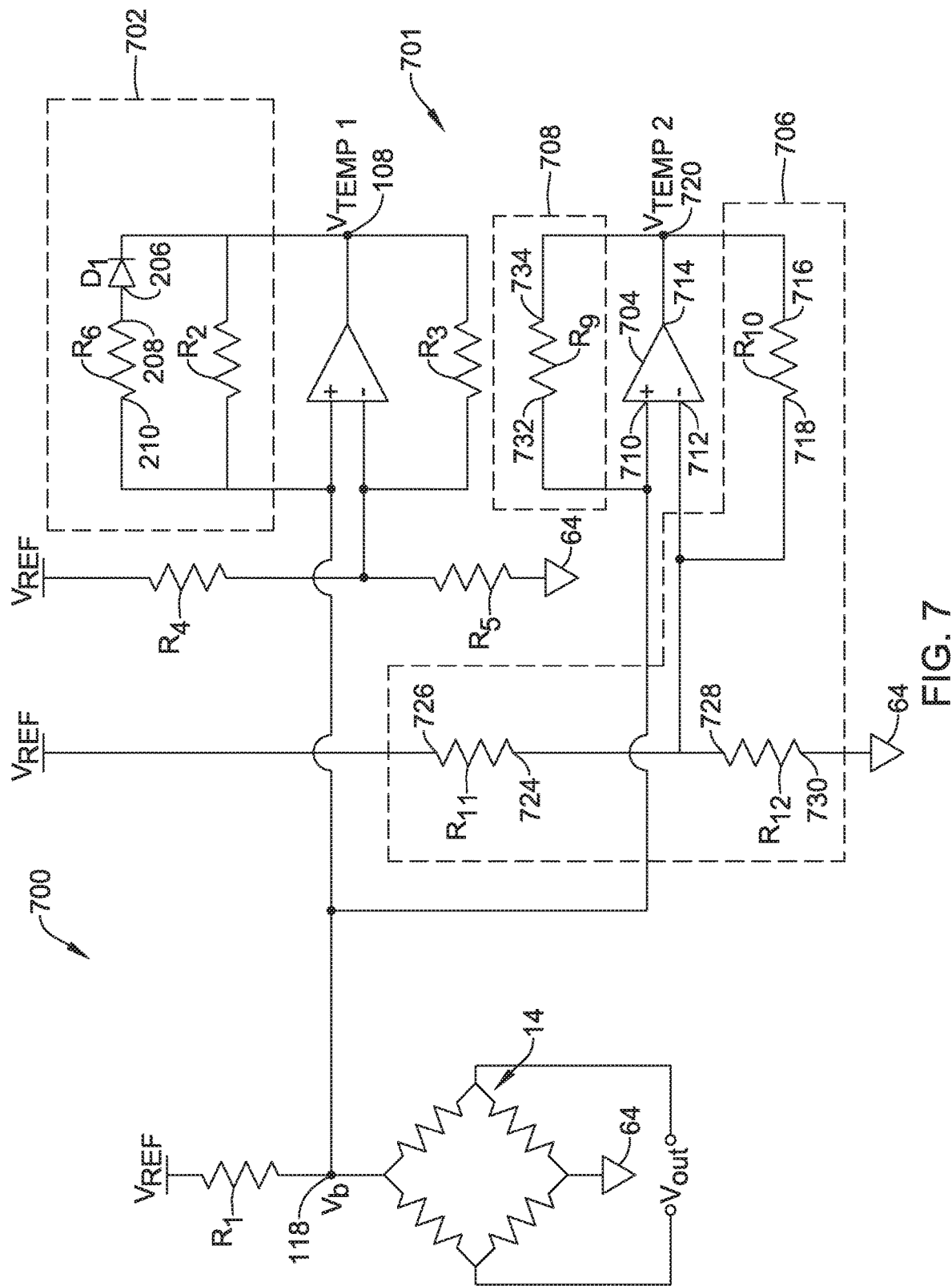
FIG. 7 is another exemplary device.

FIG. 7 depicts another compensation circuit 700 that may enable a more temperature independent output ($V_{out}$) across a range of temperatures, similar to the compensation circuits 136 and 200. In various embodiments, the compensation circuit 700 may have a negative resistance 701 configured to operate similar to the negative resistance 102. However, the negative resistance 701 may have a positive feedback loop 702 that further includes an impedance in parallel with $R_2$. In some cases, the impedance includes the diode $D_1$ having the anode end 204 coupled to the amplifier output node 108 and the resistor $R_6$ having the terminal 208 coupled to the cathode end 206 of $D_1$ and the terminal 210 coupled to the terminal node 118. In some cases, the bridge circuit 14 may operate at an increased temperature and the difference between $V_{TEMP}$ and $V_b$ may exceed the forward threshold voltage of $D_1$. Accordingly, $D_1$ may begin to conduct and allow current to flow from the amplifier output node 108 through $R_6$, to the terminal node 118. The conduction of $D_1$ may be gradual. As such, as the difference between $V_{TEMP}$ and $V_b$ increases, the current through $D_1$ may increase, and apply increasing amounts of non-linear compensation. This gradual conduction of $D_1$ may match the gradual need for more compensation of the bridge circuit 14. With careful selection of resistor values (e.g., resistor values of $R_1$, $R_2$, $R_3$, $R_4$, $R_5$, etc.), this matching may enable the compensation circuit 700 to achieve better than +/−0.2 percent span error of the bridge circuit 14 output signal ($V_{out}$).

In certain embodiments, the compensation circuit 700 may also include an additional amplifier 704, a negative feedback loop 706, and a positive feedback loop 708. In some cases, the amplifier 704 may be an op-amp and may have its non-inverting input 710 coupled to the terminal node 118. In some cases, the negative feedback loop 706 may have an impedance that includes resistor $R_{10}$ and a voltage divider that includes resistors $R_{11}$ and $R_{12}$. In some cases, $R_{10}$ may have a terminal 716 coupled to the output terminal 714 of the amplifier 704 at an amplifier output node 720 and a terminal 718 coupled to the inverting input terminal 712 of the amplifier 704 at an inverting input node 722. In some cases, $R_{11}$ may have a terminal 724 coupled to the inverting input node 722 and a terminal 726 coupled to a signal generating source ($V_{REF}$). In some cases, $R_{12}$ may have a terminal 728 coupled to the inverting input node 722 and a terminal 730 coupled to ground 64. In certain embodiments, the positive feedback loop 708 may have an impedance that includes resistor $R_9$ that has a terminal 732 coupled to the terminal node 118 and a terminal 734 coupled to the amplifier output node 108.

In some cases, the compensation circuit 700 may employ multiple negative impedance converters (NIC). In some cases, the threshold and gain of the second NIC (i.e., the amplifier 704, the negative feedback loop 706, and the positive feedback loop 708) may be chosen such that the amplifier 704 output ($V_{TEMP2}$) may be saturated against one or more of the power supply rails for a portion of the operating range. The discussion below will consider the case where the $2^{nd}$ amplifier 704 is saturated against the positive supply rail ($V_{REF}$) for medium and high temperatures. This amplifier 704 comes out of saturation at low temperatures when additional self-compensation is needed. While the amplifier 704 is in saturation, the NIC function of the amplifier 704, the negative feedback loop 706, and the positive feedback loop 708 may be non-functional and $R_9$ may become a positive resistance that is effectively in parallel with $R_1$, reducing the effective value of $R_1$. When the resistance of the bridge circuit 14 changes to the point that $V_{TEMP2}$ is no longer saturated against a rail, $R_9$ may become a negative resistance in parallel with $R_1$. Thus, the effective resistance driving the bridge may now be greater. Therefore, the driving impedance of the bridge circuit 14 may change at the point that the amplifier 704 comes out of saturation and changes the self-compensating effect on the bridge circuit 14. More NICs may be added to create additional breakpoints. Breakpoints affecting high temperatures are achieved by biasing the additional amplifier(s) such that they are against the negative rail for low and medium temperatures and become active at the desired breakpoint at high temperature(s).

Figure 8A:
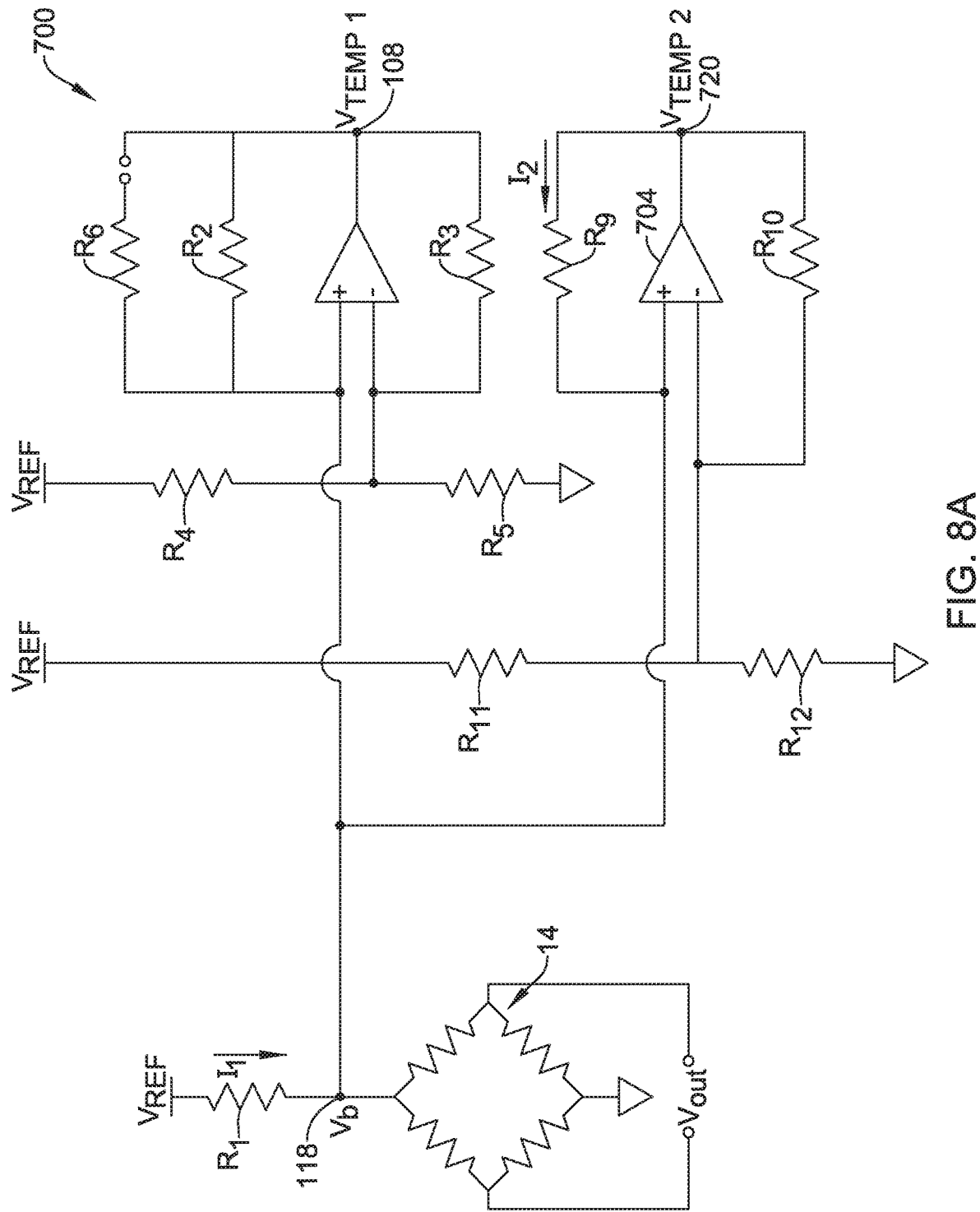
FIGS. 8A-8C depict an exemplary operation of the device.
Figure 8B:
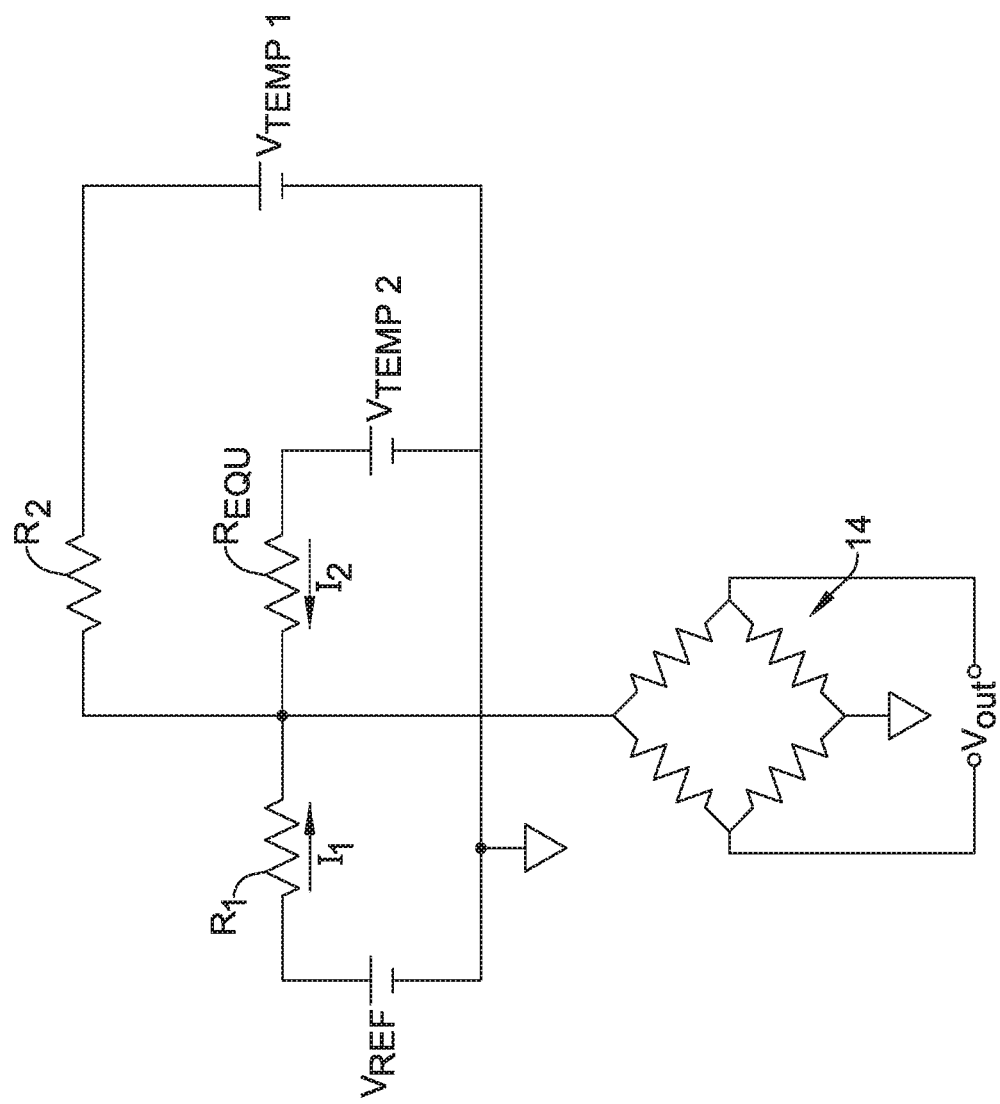
Figure 8C:
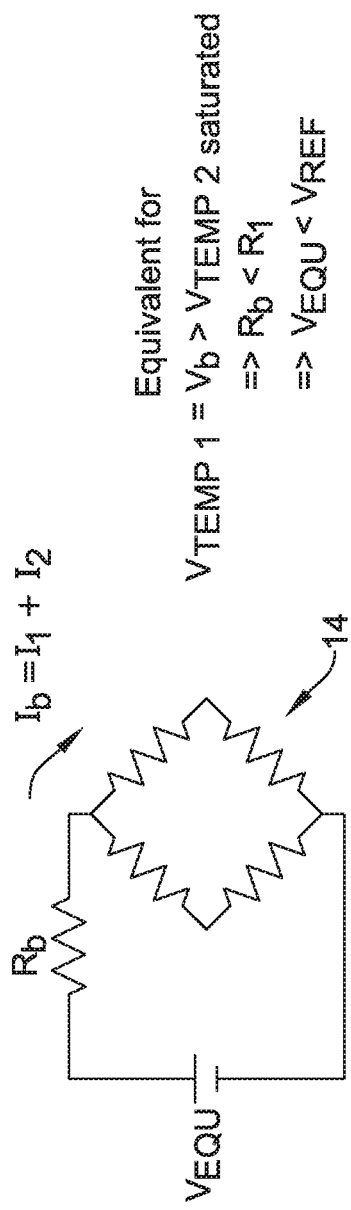
Figure 9A:
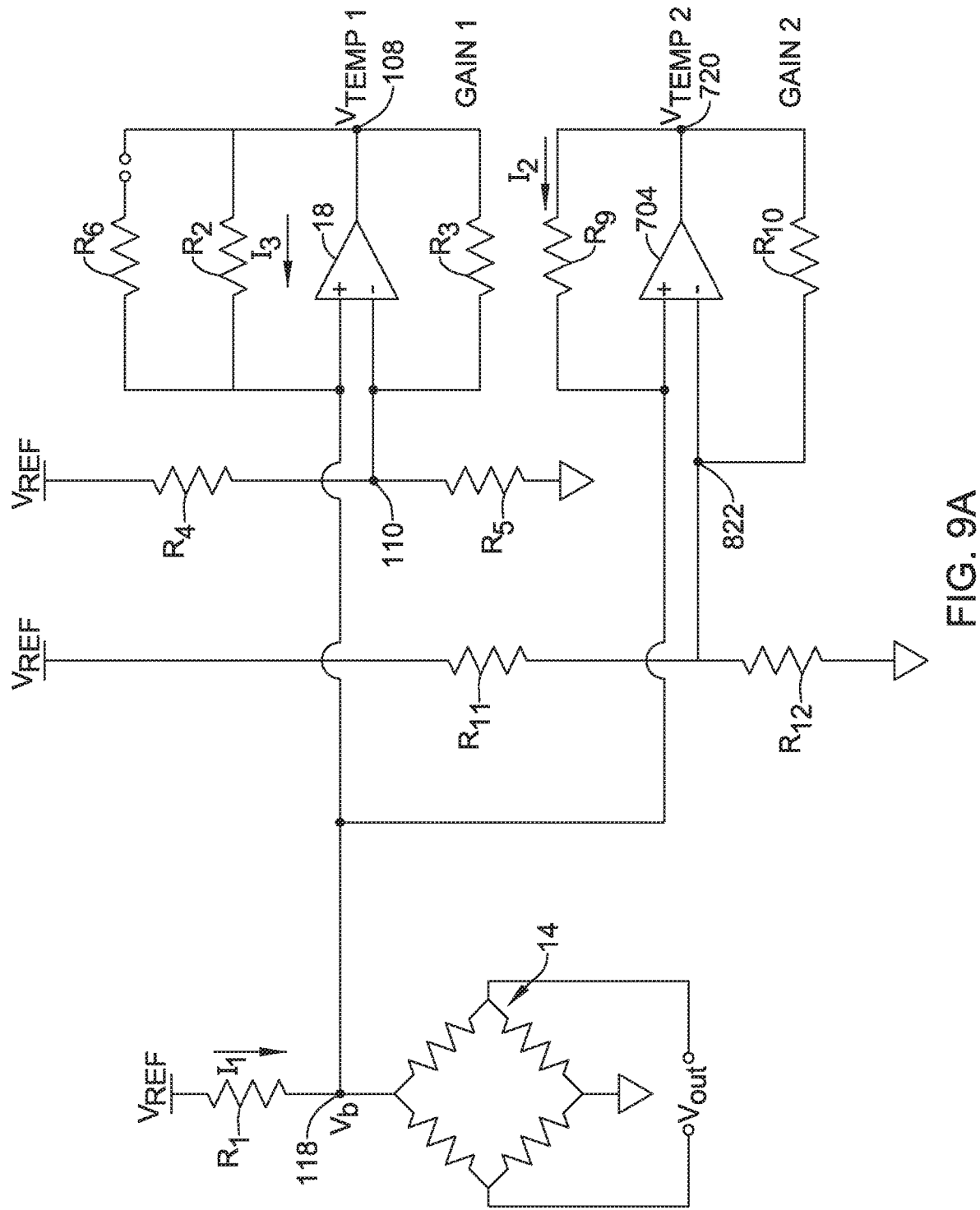
FIGS. 9A-9C depict an exemplary operation of the device.
Figure 9B:
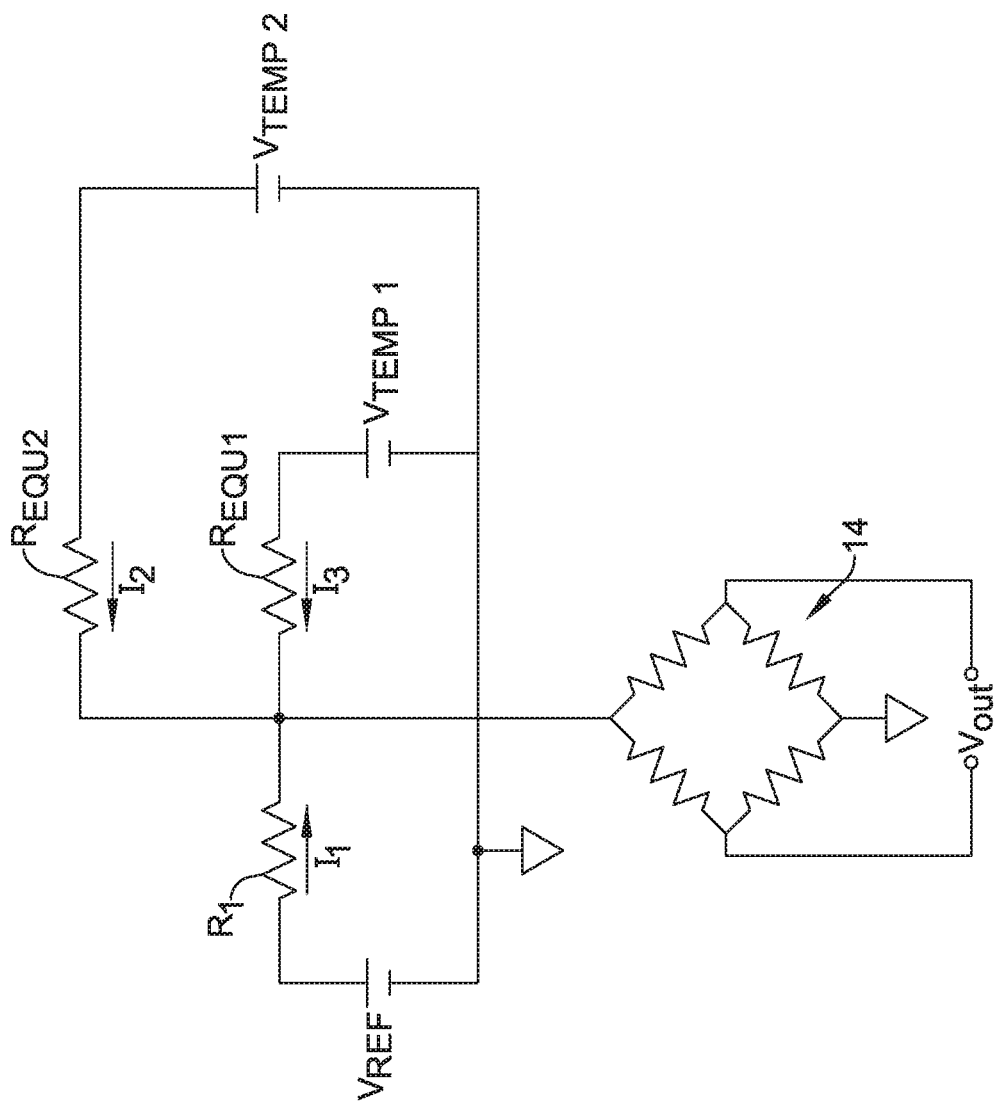
Figure 9C:
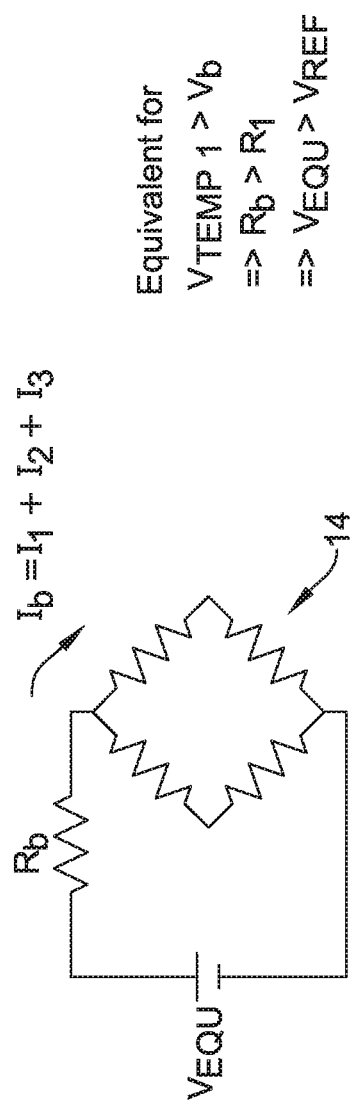

FIGS. 8A-8C depict the operation of the compensation circuit 700 when the bridge circuit 14 is operating in the normal temperature range (e.g., between 0° C. and 85° C.). In this example, $V_{REF}$ is a signal generating source and $I_1$ flows through $R_1$. While operating in the normal temperature range, the bridge voltage $V_b$ at the terminal node 118 may be equal to the voltage of the divider formed by $R_4$ and $R_5$ at the inverting input node 110. As such, $V_{TEMP1}$ may also be equal to $V_b$ at the amplifier output node 108. At this condition the voltage across $R_2$ may be zero. Accordingly, the difference between $V_{TEMP}$ and $V_b$ may not be great enough to exceed the forward threshold voltage of $D_1$. Therefore, $D_1$ may not allow current to flow through $R_6$ ($D_1$ is shown as an open circuit in FIG. 8A to illustrate that no current will flow through that respective branch). However, when the bridge circuit 14 is operating in the normal temperature range, as discussed above, the amplifier 704 may be in saturation such that $V_{TEMP2}$ is saturated against one or more of the power supply rails (against the positive rail in this example explanation) and 12 flows from the amplifier output node 720 to terminal 118 through $R_9$. Accordingly, as shown in FIG. 8B, $R_9$ may become a positive resistance that is effectively in parallel with $R_1$. Furthermore, $I_2$ may add to $I_1$, increasing the excitation from $R_1$. As a result, turning to FIG. 8C, the equivalent circuit for the circuit in FIG. 9A is shown. As can be seen, $I_b$ may be equal to $I_1+I_2$ and $R_b$ may be less than $R_1$.

When the compensation circuit 700 is operating in the decreased temperature range (e.g., below 0° C.), the bridge circuit 14 resistance may decrease to the point that the amplifier 704 comes out of saturation. Accordingly, when $V_{TEMP2}$ comes out of saturation the voltage driving $R_9$ is no longer the full value of $V_{REF}$ and decays progressively lower as the bridge resistance continues to decrease with colder temperatures. Thus the degree of self-compensation is greater at temperatures below the breakpoint because $R_9$ changes from a positive resistor to a negative resistor.

FIGS. 9A-9F depict the operation of the compensation circuit 700 when the bridge circuit 14 is operating in the increased temperature range. Once again, in this example, $V_{REF}$ is a signal generating source and $I_1$ flows through $R_1$. While operating in the increased $V_b$ may increase such that it is greater than the voltage of the divider formed by $R_4$ and $R_5$ at the inverting input node 110 and the voltage of the divider formed by $R_{11}$ and $R_{12}$ at the inverting input node 722. As such, $V_{TEMP1}$ may increase by the closed loop gain of the amplifier 18 and $V_{TEMP2}$ may increase by the closed loop gain of the amplifier 704. In this example, the closed loop gain of the amplifiers 18 and 704 will likely be different. In this increased temperature condition, $V_{TEMP1}$ may be higher than $V_b$ and $V_{TEMP2}$ will be saturated against the positive power supply rail. As such, the voltage across $R_2$ may result in a current ($I_3$) from the amplifier output node 108 to the terminal node 118 and the voltage across $R_9$ may result in $I_2$ from the amplifier output node 720 to the terminal node 118. However, the difference between $V_{TEMP}$ and $V_b$ may not be great enough to exceed the forward threshold voltage of $D_1$. Therefore, $D_1$ may not allow current to flow through $R_6$ ($D_1$ is shown as open circuits in FIG. 9A to illustrate that no current will flow through that respective branch). As such, turning to FIG. 9B, $I_3$ only flows through $R_2$, thus, $R_{EQU1}$=−1*$R_2$/gain1 and $R_{EQU2}$=−1*$R_9$/gain2. As can be seen, because 13 flows from the amplifier output node 108 to the terminal node 118 and $I_2$ flows from the amplifier output node 720 to the terminal node 118 when $V_{TEMP}$>$V_b$, $R_{EQU}$ may comprise a negative resistance that is effectively in parallel with $R_1$. Therefore, $I_2$ and $I_3$ may add to $I_1$, adding to the excitation from $R_1$, and further increasing the bridge excitation as if the source voltage is $V_{EQU}$, which may be greater than $V_{REF}$. As a result, turning to FIG. 9C, the equivalent circuit for the circuit in FIG. 9A is shown. As can be seen, $I_b$ may be equal to $I_1+I_2+I_3$ and $R_b$ is the parallel combination of $R_1$, $R_{EQU1}$ and $R_{EQU2}$. Thus, $R_b$=1/(1/$R_1$+1/$R_{EQU1}$+1/$R_{EQU2}$).

Figure 9D:
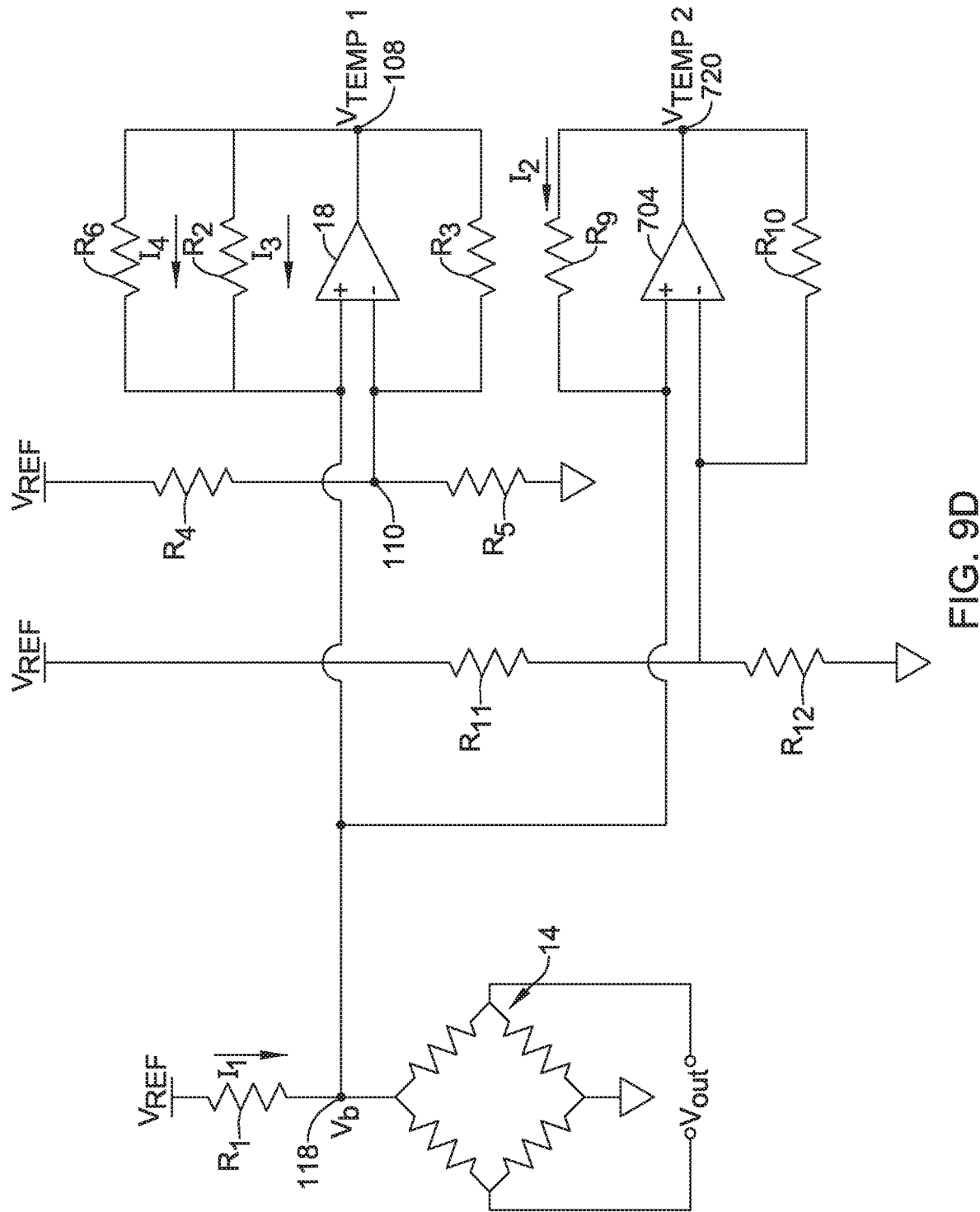
FIGS. 9D-9F depict an exemplary operation of the device.
Figure 9E:
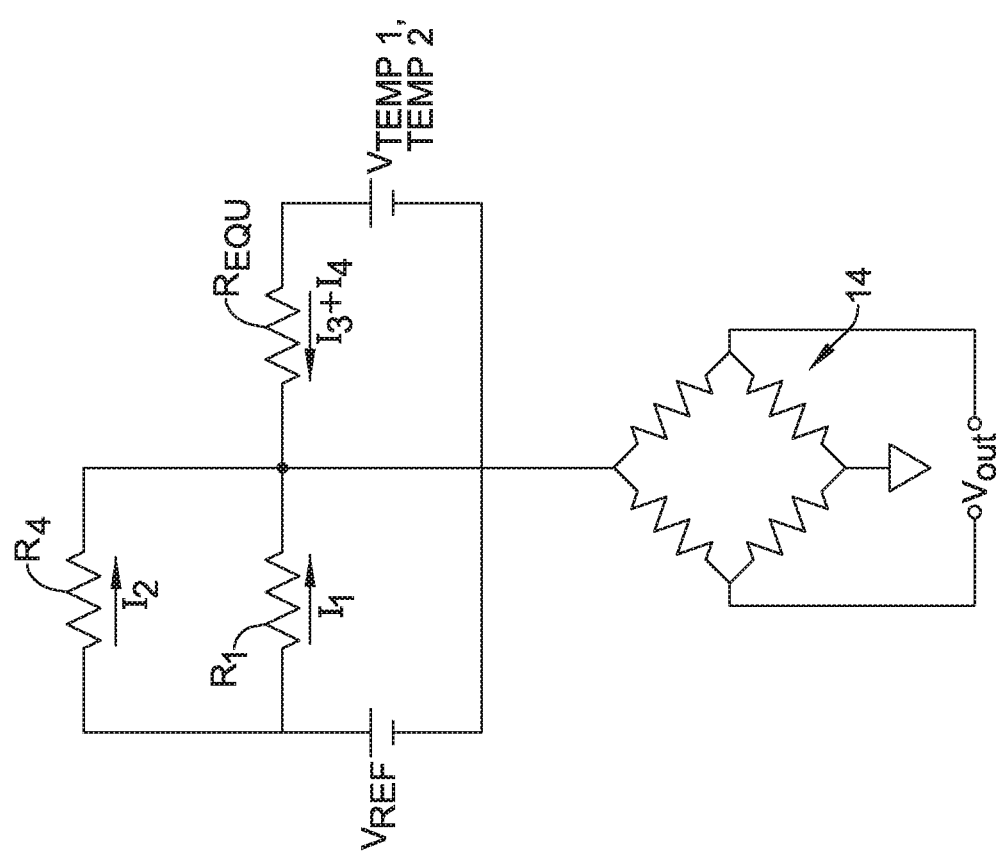
Figure 9F:
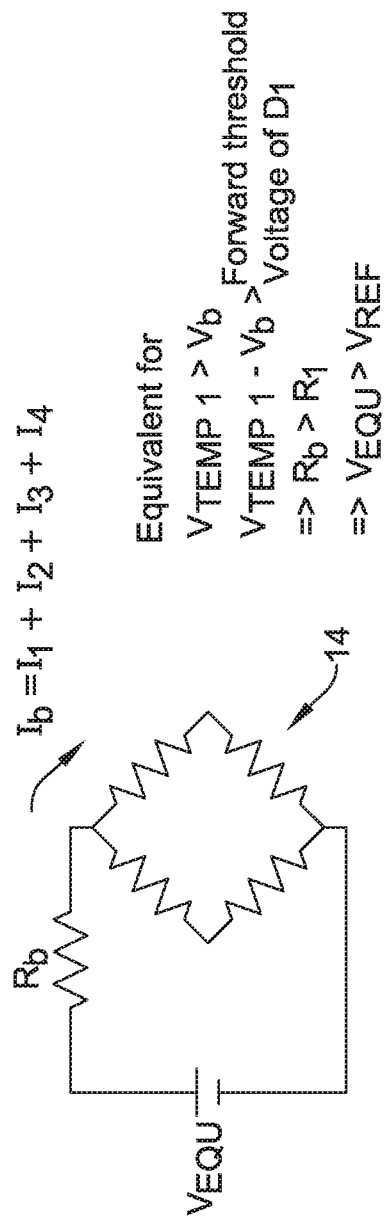

Turning to FIG. 9D, in some cases, when the bridge circuit 14 is operating at an increased temperature and the difference between $V_{TEMP}$ and $V_b$ exceeds the forward threshold voltage of $D_1$, $D_1$ may begin to conduct and allow current ($I_4$) to flow from the amplifier output node 108 through the resistor $R_6$, to the terminal node 118 in addition to the current $I_3$ already flowing from the amplifier output node 108 through $R_2$ to the terminal node 118 and the current $I_2$ already flowing from the amplifier output node 720 through $R_9$ to the terminal node 118. As such, turning to FIG. 9E, at the high temperatures currently under discussion, $V_{TEMP2}$ may be in saturation and $R_{EQU}$=−1*($R_2$*($R_6$+$R_{D1}$)/($R_2$+$R_6$+$R_{D1}$)*1/gain. $R_b$ is the parallel combination of $R_1$, $R_4$ and $R_{EQU}$. As can be seen, because $I_3$ and $I_4$ flow from the amplifier output node 108 to the terminal node 118 and $I_2$ flows from the amplifier output node 720 to the terminal node 118 when $V_{TEMP1}$>$V_b$, $V_{TEMP2}$>$V_b$, and $V_{TEMP1}$−$V_b$>the forward threshold voltage of $D_1$, $R_{EQU}$ may comprise a negative resistance that is effectively in parallel with $R_1$. Therefore, $I_2$, $I_3$, and $I_4$ may add to $I_1$, adding to the excitation from $R_1$, and further increasing the bridge excitation as if the source voltage is $V_{EQU}$, which may be greater than $V_{REF}$. As a result, turning to FIG. 9F, the equivalent circuit for the circuit in FIG. 9D is shown. As can be seen, $I_b$ may be equal to $I_1+I_2+I_3+I_4$, and $R_b$ may be greater than $R_1$.

To recap, a device, for adjusting a signal to a thermally sensitive bridge circuit, may incorporate a first impedance having a first terminal coupled to a terminal of the bridge circuit, and an impedance circuit coupled to the terminal of the bridge circuit, the impedance circuit incorporating an amplifier having a non-inverting input terminal coupled to the terminal of the bridge circuit, an inverting input terminal, and an output terminal, a signal adjusting circuit having a second impedance with a first terminal coupled to the output terminal of the amplifier and a second terminal coupled to the terminal of the bridge circuit, the second impedance incorporating a unidirectional current conducting mechanism, and an amplifier circuit having a third impedance with a terminal coupled to the output terminal of the amplifier.

An example of a unidirectional current conducting mechanism may be a diode or other like functional item.

The first impedance may incorporate a first resistor and the second impedance of the signal adjusting circuit further incorporating a second resistor having a first terminal coupled to the output terminal of the amplifier and a second terminal coupled to the terminal of the bridge circuit, and a fourth impedance in parallel with the second resistor, the fourth impedance having the diode having an anode end coupled to the output terminal of the amplifier; and a third resistor having a first terminal coupled to a cathode end of the diode and a second terminal coupled to the terminal of the bridge circuit.

The third impedance of the amplifier circuit may incorporate a fourth resistor having a first terminal coupled to the output terminal of the amplifier and a second terminal coupled to the inverting terminal of the amplifier, and a voltage divider circuit may incorporate a fifth resistor having a first terminal coupled to the inverting terminal of the amplifier and a second terminal coupled to a signal generating source, and a sixth resistor having a first terminal coupled to the non-inverting terminal of the amplifier and a second terminal coupled to ground.

The amplifier may be an operational amplifier.

The second impedance of the signal adjusting circuit may further incorporate a fifth impedance in parallel with the second resistor, the fifth impedance having a second diode with a cathode end coupled to the output terminal of the amplifier, and a seventh resistor having a first terminal coupled to an anode end of the diode and a second terminal coupled to the terminal of the bridge.

The device may further incorporate a fifth impedance coupled to the terminal of the bridge circuit, the fifth impedance circuit incorporating a second amplifier having a non-inverting input terminal, an inverting input terminal, and an output terminal with the non-inverting input terminal coupled to the terminal of the bridge circuit, a second signal adjusting circuit having a sixth impedance with a first terminal coupled to the output terminal of the second amplifier and a second terminal coupled to the terminal of the bridge circuit, and a second amplifier circuit having a seventh impedance coupled to the output terminal of the second amplifier.

The sixth impedance of the second signal adjusting circuit may incorporate an eighth resistor, and the seventh impedance of the second amplifier circuit may incorporate a ninth resistor having a first terminal coupled to the output terminal of the second amplifier and a second terminal coupled to the inverting terminal of the second amplifier, and a second voltage divider circuit incorporating a tenth resistor having a first terminal coupled to the inverting terminal of the second amplifier and a second terminal coupled to the signal generating source, and an eleventh resistor having a first terminal coupled to the non-inverting terminal of the second amplifier and a second terminal coupled to the ground.

The second amplifier may be a second operational amplifier.

The bridge circuit may be a piezo-resistive bridge circuit.

A compensation circuit for a piezo-resistive bridge circuit having an output terminal coupled to a bridge output node and a first impedance having a terminal coupled to the bridge output node, the compensation circuit may incorporate an amplifier having a non-inverting input terminal coupled to the bridge output node, an inverting input terminal coupled to an inverting input node, and an amplifier output terminal coupled to an amplifier output node; a negative feedback loop having a second impedance with a first terminal coupled to the inverting input node and a second terminal coupled to the amplifier output node; and a positive feedback loop having a third impedance with a first terminal coupled to the bridge output node and a second terminal coupled to the amplifier output node, the third impedance incorporating a diode such that exceeds a forward threshold voltage of the diode that allows current to flow from the amplifier output node through the positive feedback loop to the bridge output node.

The third impedance of the positive feedback loop may further incorporate a first resistor having a first terminal coupled to the amplifier output node and a second terminal coupled to the bridge output node, and a fourth impedance in parallel with the second resistor. The fourth impedance may incorporate a diode having an anode end coupled to the amplifier output node, and a third resistor having a first terminal coupled to a cathode end of the diode and a second terminal coupled to the bridge output node.

The second impedance of the negative feedback loop may further incorporate a fourth resistor having a first terminal coupled to the amplifier output node and a second terminal coupled to the inverting input node, and a voltage divider circuit incorporating a fifth resistor having a first terminal coupled to the inverting input node and a second terminal coupled to a signal generating source, and a sixth resistor having a first terminal coupled to the non-inverting input node and a second terminal coupled to ground.

The amplifier may be an operational amplifier.

The third impedance of the positive feedback loop may further incorporate a fifth impedance in parallel with the second resistor. The fifth impedance may incorporate a seventh resistor having a first terminal coupled to the bridge output node, and a second diode having an anode end coupled to a second terminal of the seventh resistor and a cathode end coupled to the amplifier output node such that exceeding a forward threshold voltage of the second diode allows current to flow from the bridge output node through the positive feedback loop to the amplifier output node.

The compensation circuit may further incorporate a second operational-amplifier having a non-inverting input terminal coupled to the bridge output node, an inverting input terminal coupled to a second inverting input node, and an amplifier output terminal coupled to a second amplifier output node, a second negative feedback loop having a fifth impedance with a first terminal coupled to the second inverting input node and a second terminal coupled to the amplifier output node, and a second positive feedback loop having a sixth impedance with a first terminal coupled to the bridge output node and a second terminal coupled to the amplifier output node.

The sixth impedance of the second positive feedback loop may incorporate a seventh resistor, and the fifth impedance of the second negative feedback loop may incorporate an eighth resistor having a first terminal coupled to the second amplifier output node and a second terminal coupled to the second inverting input node, and a second voltage divider circuit that may incorporate a ninth resistor having a first terminal coupled to the second inverting input node and a second terminal coupled to the signal generating source, and a tenth resistor having a first terminal coupled to the second non-inverting input node and a second terminal coupled to the ground.

A device for adjusting a signal to a thermally sensitive bridge circuit may have an impedance coupled to the bridge circuit and an impedance circuit also coupled to the bridge circuit. The impedance circuit may incorporate an amplifier having a non-inverting input coupled to the bridge circuit, a signal adjusting circuit coupled to the output terminal of the amplifier and to the bridge circuit, and an amplifier circuit coupled to the output of the amplifier. The signal adjusting circuit may include a unidirectional current flow mechanism such as a diode.

A compensation circuit for a piezo-resistive bridge circuit, may incorporate a first impedance having a terminal coupled to a bridge output node that is also coupled to a terminal of the piezo-resistive bridge circuit; an operational-amplifier having a non-inverting input terminal coupled to the bridge output node, an inverting input terminal coupled to an inverting input node, and an operational-amplifier output terminal coupled to an amplifier output node; a negative feedback loop having a second impedance with a first terminal coupled to the inverting input node and a second terminal coupled to the amplifier output node; and a positive feedback loop having a third impedance with a first terminal coupled to the bridge output node and a second terminal coupled to the amplifier output node, the third impedance incorporating a diode such that exceeding a forward threshold voltage of the diode allows current to flow from the amplifier output node through the positive feedback loop to the bridge output node.

The first impedance may be a first resistor and the third impedance of the positive feedback loop may further incorporate a second resistor having a first terminal coupled to the amplifier output node and a second terminal coupled to the bridge output node, a fourth impedance in parallel with the second resistor. The fourth impedance may incorporate a diode having an anode end coupled to the amplifier output node, and a third resistor having a first terminal coupled to a cathode end of the diode and a second terminal coupled to the bridge output node. The second impedance of the negative feedback loop may incorporate a fourth resistor having a first terminal coupled to the amplifier output node and a second terminal coupled to the inverting input node, and a voltage divider circuit incorporating a fifth resistor having a first terminal coupled to the inverting input node terminal and a second terminal coupled to a signal generating source, and a sixth resistor having a first terminal coupled to the non-inverting input node and a second terminal coupled to ground.

The third impedance of the positive feedback loop may further incorporate a fifth impedance in parallel with the second resistor. The fifth impedance may incorporate a seventh resistor having a first terminal coupled to the bridge output node, and a second diode having an anode end coupled to a second terminal of the seventh resistor and a cathode end coupled to the amplifier output node such that exceeding a forward threshold voltage of the second diode allows current to flow from the bridge output node through the positive feedback loop to the amplifier output node.

The compensation circuit may further incorporate a second operational-amplifier having a non-inverting input terminal coupled to the bridge output node, an inverting input terminal coupled to a second inverting input node, and an amplifier output terminal coupled to a second amplifier output node; a second negative feedback loop having a fifth impedance with a first terminal coupled to the second inverting input node and a second terminal coupled to the amplifier output node; and a second positive feedback loop having a sixth impedance with a first terminal coupled to the bridge output node and a second terminal coupled to the amplifier output node.

In the present specification, some of the matter may be of a hypothetical or prophetic nature although stated in another manner or tense.

The above description is intended to be illustrative, and not restrictive. For example, the above-described examples (or one or more aspects thereof) may be used in combination with each other. Also, in the above Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A device for adjusting a signal to a bridge circuit, the device comprising:
    a first impedance, having a first resistor, having a first terminal coupled to a terminal of the bridge circuit; and
    an impedance circuit coupled to the terminal of the bridge circuit, the impedance circuit comprising:
        an amplifier having a non-inverting input terminal coupled to the terminal of the bridge circuit, an inverting input terminal, and an output terminal;
        a signal adjusting circuit having a second impedance with a first terminal coupled to the output terminal of the amplifier and a second terminal coupled to the terminal of the bridge circuit, the second impedance incorporating a unidirectional conductor, such as at least two diodes, wherein a first diode has an anode end coupled to the output terminal of the amplifier and a second diode has a cathode end coupled to the output terminal of the amplifier, and wherein the second impedance of the signal adjusting circuit further comprises:
        a second resistor having a first terminal coupled to the output terminal of the amplifier and a second terminal coupled to the terminal of the bridge circuit, and
        a fourth impedance in parallel with the second resistor, the fourth impedance comprising:
        the first diode having the anode end coupled to the output terminal of the amplifier; and
        a third resistor having a first terminal coupled to a cathode end of the first diode and a second terminal coupled to the terminal of the bridge circuit; and an amplifier circuit having a third impedance with a. terminal coupled to:
        the output terminal of the amplifier;
        the anode end of the first diode; and
        the cathode end of the second diode.

2. The device of claim 1, wherein the third impedance of the amplifier circuit comprises:
    a fourth resistor having a first terminal coupled to the output terminal of the amplifier and a second terminal coupled to the inverting input terminal of the amplifier; and
    a voltage divider circuit comprising:
    a fifth resistor having a first terminal coupled to the inverting input terminal of the amplifier and a second terminal coupled to a signal generating source; and
    a sixth resistor having a first terminal coupled to the non-inverting input terminal of the amplifier and a second terminal coupled to a ground.

3. The device of claim 2, wherein the amplifier is an operational amplifier.

4. The device of claim 2, wherein the second impedance of the signal adjusting circuit further comprises a fifth impedance in parallel with the second resistor, the fifth impedance comprising:
    the second diode having a the cathode end coupled to the output terminal of the amplifier; and a seventh resistor having a first terminal coupled to an anode end of the second diode and a second terminal coupled to the terminal of the bridge circuit.

5. The device of claim 2, the device further comprising:
a fifth impedance coupled to the terminal of the bridge circuit, the fifth impedance comprising:
a second amplifier having a non-inverting input terminal, an inverting input terminal, and an output terminal with the non-inverting input terminal coupled to the terminal of the bridge circuit;
a second signal adjusting circuit having a sixth impedance with a first terminal coupled to the output terminal of the second amplifier and a second terminal coupled to the terminal of the bridge circuit; and
a second amplifier circuit having a seventh impedance coupled to the output terminal of the second amplifier.

6. The device of claim 5, wherein the sixth impedance of the second signal adjusting circuit comprises an eighth resistor and the seventh impedance of the second amplifier circuit comprises:
a ninth resistor having a first terminal coupled to the output terminal of the second amplifier and a second terminal coupled to the inverting input terminal of the second amplifier; and
a second voltage divider circuit comprising:
a tenth resistor having a first terminal coupled to the inverting input terminal of the second amplifier and a second terminal coupled to the signal generating source; and
an eleventh resistor having a first terminal coupled to the non-inverting input terminal of the second amplifier and a second terminal coupled to the ground.

7. The device of claim 5, wherein the second amplifier is a second operational amplifier.

8. The device of claim 1, wherein the bridge circuit is a piezo-resistive bridge circuit.

9. A compensation circuit for a bridge circuit having a bridge output node and a first impedance having a terminal coupled to the bridge output node, the compensation circuit comprising:
an amplifier having a non-inverting input terminal coupled to the bridge output node, an inverting input terminal coupled to an inverting input node, and an amplifier output terminal coupled to an amplifier output node;
a negative feedback loop having a second impedance with a first terminal coupled to the inverting input node and a second terminal coupled to the amplifier output node; and
a positive feedback loop having a third impedance with a first terminal coupled to the bridge output node and a second terminal coupled to the amplifier output node, the third impedance incorporating at least two diodes such that exceeding a forward threshold voltage of a first diode allows current to flow from the amplifier output node through the positive feedback loop to the bridge output node and exceeding a forward threshold voltage of a second diode allows current to flow from the bridge output node through the positive feedback loop to the amplifier output node, wherein the third impedance of the positive feedback loop further comprises:
a first resistor having a first terminal coupled to the amplifier output node and a second terminal coupled to the bridge output node; and
a fourth impedance in parallel with a second resistor, the fourth impedance comprising:
the first diode having an anode end coupled to the amplifier output node; and
a third resistor having a first terminal coupled to a cathode end of the first diode and a second terminal coupled to the bridge output node.

10. The compensation circuit of claim 9, wherein the second impedance of the negative feedback loop further comprises:
a fourth resistor having a first terminal coupled to the amplifier output node and a second terminal coupled to the inverting input node; and
a voltage divider circuit comprising:
a fifth resistor having a first terminal coupled to the inverting input node and a second terminal coupled to a signal generating source; and
a sixth resistor having a first terminal coupled to the non-inverting input terminal and a second terminal coupled to ground.

11. The compensation circuit of claim 9, wherein the amplifier is an operational amplifier.

12. The compensation circuit of claim 10, wherein the third impedance of the positive feedback loop further comprises a fifth impedance in parallel with the second resistor, the fifth impedance comprising:
a seventh resistor having a first terminal coupled to the bridge output node; and
the second diode having an anode end coupled to a second terminal of the seventh resistor and a cathode end coupled to the amplifier output node.

13. The compensation circuit of claim 10, further comprising:
a second operational-amplifier having a second non-inverting input terminal coupled to the bridge output node, an inverting input terminal coupled to a second inverting input node, and an amplifier output terminal coupled to a second amplifier output node;
a second negative feedback loop having a fifth impedance with a first terminal coupled to the second inverting input node and a second terminal coupled to the second amplifier output node; and
a second positive feedback loop having a sixth impedance with a first terminal coupled to the bridge output node and a second terminal coupled to the second amplifier output node.

14. The compensation circuit of claim 13, wherein the sixth impedance of the second positive feedback loop comprises a seventh resistor and the fifth impedance of the second negative feedback loop comprises:
an eighth resistor having a first terminal coupled to the second amplifier output node and a second terminal coupled to the second inverting input node; and
a second voltage divider circuit comprising:
a ninth resistor having a first terminal coupled to the second inverting input node and a second terminal coupled to the signal generating source; and
a tenth resistor having a first terminal coupled to the second non-inverting input terminal and a second terminal coupled to the ground.

15. A compensation circuit for a bridge circuit, the compensation circuit comprising:
a first impedance, having a first resistor, having a terminal coupled to a bridge output node of the bridge circuit;
an operational-amplifier having a non-inverting input terminal coupled to the bridge output node, an inverting input terminal coupled to an inverting input node, and an operational-amplifier output terminal coupled to an amplifier output node;

a negative feedback loop having a second impedance with a first terminal coupled to the inverting input node and a second terminal coupled to the amplifier output node; and a positive feedback loop having a third impedance with a first terminal coupled to the bridge output node and a second terminal coupled to the amplifier output node, the third impedance incorporating at least two diodes such that exceeding a forward threshold voltage of a first diode allows current to flow from the amplifier output node through the positive feedback loop to the bridge output node, and exceeding a forward threshold voltage of a second diode allows current to flow from the bridge output node through the positive feedback loop to the amplifier output node, wherein the third impedance of the positive feedback loop further comprises:

a second resistor having a first terminal coupled to the amplifier output node and a second terminal coupled to the bridge output node;

a fourth impedance in parallel with the second resistor, the fourth impedance comprising:

the first diode having an anode end coupled to the amplifier output node; and a third resistor having a first terminal coupled to a cathode end of the first diode and a second terminal coupled to the bridge output node; and wherein the second impedance of the negative feedback loop comprises:

a fourth resistor having a first terminal coupled to the amplifier output node and a second terminal coupled to the inverting input node; and a voltage divider circuit comprising:

a fifth resistor having a first terminal coupled to the inverting input terminal and a second terminal coupled to a signal generating source; and a sixth resistor having a first terminal coupled to the non-inverting input terminal and a second terminal coupled to ground.

16. The compensation circuit of claim 15, wherein the third impedance of the positive feedback loop further comprises a fifth impedance in parallel with the second resistor, the fifth impedance comprising:

a seventh resistor having a first terminal coupled to the bridge output node; and the second diode having an anode end coupled to a second terminal of the seventh resistor and a cathode end coupled to the amplifier output node.

17. The compensation circuit of claim 15, the compensation circuit further comprising:

a second operational-amplifier having a non-inverting input terminal coupled to the bridge output node, an inverting input terminal coupled to a second inverting input node, and an amplifier output terminal coupled to a second amplifier output node;

a second negative feedback loop having a fifth impedance with a first terminal coupled to the second inverting input node and a second terminal coupled to the second amplifier output node; and a second positive feedback loop having a sixth impedance with a first terminal coupled to the bridge output node and a second terminal coupled to the second amplifier output node.

* * * * *